US008337656B2

United States Patent
Nishio et al.

(10) Patent No.: US 8,337,656 B2
(45) Date of Patent: Dec. 25, 2012

(54) PRESSURE-SENSITIVE ADHESIVE SHEET, METHOD OF PROCESSING ADHEREND WITH THE PRESSURE-SENSITIVE ADHESIVE SHEET, AND APPARATUS FOR STRIPPING PRESSURE-SENSITIVE ADHESIVE SHEET

(75) Inventors: Akinori Nishio, Ibaraki (JP); Kazuyuki Kiuchi, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 225 days.

(21) Appl. No.: 12/736,804

(22) PCT Filed: May 1, 2009

(86) PCT No.: PCT/JP2009/001983
§ 371 (c)(1),
(2), (4) Date: Nov. 10, 2010

(87) PCT Pub. No.: WO2009/139126
PCT Pub. Date: Nov. 19, 2009

(65) Prior Publication Data
US 2011/0067808 A1 Mar. 24, 2011

(30) Foreign Application Priority Data
May 12, 2008 (JP) ................................. 2008-124560

(51) Int. Cl.
*B32B 38/10* (2006.01)

(52) U.S. Cl. ...................................... 156/247; 428/213
(58) Field of Classification Search .................. 156/247, 156/584; 428/213
See application file for complete search history.

(56) References Cited

U.S. PATENT DOCUMENTS

| 2006/0188725 A1 | 8/2006 | Yoshida et al. |
| 2007/0059903 A1 | 3/2007 | Yano et al. |

(Continued)

FOREIGN PATENT DOCUMENTS

EP  1695820 A1  8/2006
(Continued)

OTHER PUBLICATIONS

International Search Report dated Aug. 18, 2009, issued for PCT/JP2009/001983.

*Primary Examiner* — Khanh P Nguyen
*Assistant Examiner* — Margaret Squalls
(74) *Attorney, Agent, or Firm* — Edwards Wildman Palmer LLP (57) ABSTRACT

To provide a pressure-sensitive adhesive sheet which protects a ground, thin, fragile adherend from "warping" and which can be removed from the fragile adherend after the completion of backgrinding without damaging and contaminating the fragile adherend. The pressure-sensitive adhesive sheet 5 includes a base layer A, a pressure-sensitive adhesive layer A, a base layer B, and a pressure-sensitive adhesive layer B arranged in this order, in which: the base layer A has a product of its Young's modulus at 25° C. and its thickness of $1.0 \times 10^5$ to $4.0 \times 10^5$ N/m and a product of its Young's modulus at 80° C. and its thickness of $2.8 \times 10^5$ N/m or less; the pressure-sensitive adhesive layer A has a shear modulus at 80° C. of 0.2 MPa or less; the base layer B has a product of its Young's modulus at 25° C. and its thickness of smaller than that of the base layer A and has, upon 80° C. heating, a shrink percentage in MD and a shrink percentage in TD of each 20% or more; and the pressure-sensitive adhesive layer B has a Young's modulus at 80° C. of 10 MPa or more and an adhesive strength to a silicon wafer (180-degree peel at a tensile speed of 300 mm/min) of 0.2 N/10 mm or less.

17 Claims, 1 Drawing Sheet

FOREIGN PATENT DOCUMENTS

| | | |
|---|---|---|
| EP | 1760132 A1 | 3/2007 |
| JP | 2000-129223 A | 5/2000 |
| JP | 2000-129227 A | 5/2000 |
| JP | 2003-209073 A | 7/2003 |
| JP | 2005-353859 A | 12/2005 |
| JP | 2006-196823 A | 7/2006 |
| JP | 2006-264296 A | 10/2006 |
| JP | 2007-070434 A | 3/2007 |

PRESSURE-SENSITIVE ADHESIVE SHEET, METHOD OF PROCESSING ADHEREND WITH THE PRESSURE-SENSITIVE ADHESIVE SHEET, AND APPARATUS FOR STRIPPING PRESSURE-SENSITIVE ADHESIVE SHEET

TECHNICAL FIELD

The present invention relates to a pressure-sensitive adhesive sheet adopted as a pressure-sensitive adhesive sheet which is used for temporarily fixing an adherend to protect the adherend from "cracking" and "chipping" caused by polishing or grinding of the adherend. The pressure-sensitive adhesive sheet can protect the adherend from "warping" after being polished to be very thin. In addition, after use, the pressure-sensitive adhesive sheet lifts up at its periphery from the adherend upon heating and forms a peel starting point. The present invention also relates to a method of processing an adherend using the pressure-sensitive adhesive sheet, and to an apparatus for stripping the pressure-sensitive adhesive sheet.

BACKGROUND ART

A semiconductor wafer is manufactured typically from silicon, germanium, or gallium arsenide as having a large diameter, background to a predetermined thickness, subjected to a backside process (e.g., etching and/or polishing) according to necessity, and diced to give semiconductor chips. Recently, demands in semiconductor materials for thinner and lighter one are becoming stronger. In semiconductor wafers, it is required to reduce the thickness to 100 µm or even less, but such a thinly polished semiconductor wafer is very fragile and easily cracked. Therefore, semiconductor wafer processing has adopted a technique of supporting the wafer on a temporarily-fixing pressure-sensitive adhesive sheet (hereinafter also referred to as a "backgrinding tape"), and, after a necessary processing, stripping and recovering the backgrinding tape from the semiconductor wafer.

However, this technique has suffered from various problems. Specifically, upon affixation to the semiconductor wafer, the backgrinding tape receives force and thereby elastically deforms; the elastically deformed backgrinding tape generates force (stress) to restore, and the stress is transferred to the semiconductor wafer. However, the fragile semiconductor wafer after being polished to be thin has a too low rigidity to resist to the stress and suffers from "warping" or "sagging", which impedes the conveyance of the semiconductor wafer. In addition, the semiconductor wafer, if "warps" too much, may break.

Such backgrinding tape generally includes an active-energy-ray-curable pressure-sensitive adhesive layer, and, after the completion of a processing step such as polishing of a semiconductor wafer, is irradiated with an active energy ray to cure the pressure-sensitive adhesive layer to have a lower adhesive strength, and is thereby stripped or peeled from the semiconductor wafer. However, the backgrinding tape may often still adhere to the semiconductor wafer by the action of atmospheric pressure, even after whose adhesive strength has been lowered through the irradiation with an active energy ray. Accordingly, to strip off the backgrinding tape, the backgrinding tape may be picked up or rubbed so as to form a peel starting point in many cases. This operation, however, often causes damage of the fragile semiconductor wafer.

A regular apparatus for stripping a backgrinding tape (backgrinding tape stripping apparatus) is configured to remove the backgrinding tape by fixing an assembly of a semiconductor wafer and the backgrinding tape after polishing (hereinafter also referred to as a "wafer after polishing") on a vacuum chuck stage; affixing a stripping tape incorporated in the stripping apparatus to the backgrinding tape of the wafer after polishing; and stripping the backgrinding tape through peeling. The stripping tape is applied to the surface of the backgrinding tape of the wafer after polishing from an edge toward a center part thereof and is pulled up to strip off the backgrinding tape which has become unnecessary. However, it is impossible to apply such rectangular stripping tape to the round or circular backgrinding tape affixed in accordance with the round semiconductor wafer without protruding off from the edge of the backgrinding tape, and, in fact, the stripping tape may protrude off from the backgrinding tape even in a very small amount. The protruded and exposed face of the stripping tape may adhere typically to the stripping apparatus, and if the stripping tape in this state is pulled, the backgrinding tape bends together with the semiconductor wafer because of such thinness of the semiconductor wafer, and this may cause damage of the semiconductor wafer. The damage of the semiconductor wafer can be avoided by applying the stripping tape not to the edge portion but only to the core area of the backgrinding tape. In this case, however, the peel stress may not be sufficiently transferred to the backgrinding tape when the stripping tape is pulled up, and the backgrinding tape may not be removed satisfactorily.

Japanese Unexamined Patent Application Publication (JP-A) No. 2000-129223 discloses a pressure-sensitive-adhesive sheet for protecting a semiconductor wafer, including a shrinkable film, a stiff film and an energy ray-curable pressure-sensitive adhesive layer. The literature mentions that this pressure-sensitive adhesive sheet can be easily peeled off from the semiconductor wafer, by irradiating the pressure-sensitive adhesive sheet with an energy ray to allow the pressure-sensitive adhesive layer to have a lowered adhesive power and allowing the shrinkable film to shrink by a predetermined process or device, thereby causing deformation in the pressure-sensitive adhesive sheet and reducing the contact area between the semiconductor wafer and the pressure-sensitive adhesive layer. However, the present inventors selected arbitrary materials and examined similar ones to find that the pressure-sensitive adhesive sheet after heating, for example, may be folded and overlap on the semiconductor wafer surface to cause difficulties in peeling or adherend failure, typically because the contraction of a shrinkable film occurs in multiple directions.

Specifically, under present circumstances, there has been found no backgrinding tape for protecting a semiconductor wafer typically from damage during backgrinding of the semiconductor wafer, which can suppress "warping" of the semiconductor wafer even after being polished to be very thin, and, after use thereof, i.e., after the completion of backgrinding, which can be removed from the semiconductor wafer without damaging and contaminating the semiconductor wafer. In addition, there has been found no apparatus for stripping a backgrinding tape from a semiconductor wafer without damaging and contaminating the semiconductor wafer.

CITATION LIST

Patent Literature

[PTL 1] Japanese Unexamined Patent Application Publication (JP-A) No. 2000-129223

SUMMARY OF INVENTION

Technical Problem

Accordingly, an object of the present invention is to provide a pressure-sensitive adhesive sheet which is adopted as a pressure-sensitive adhesive sheet for protecting an adherend from "cracking" and "chipping" during backgrinding of the adherend, which can suppress "warping" of the polished, fragile adherend even after being polished to be very thin, and after the completion of the backgrinding, which can be stripped or peeled off from the fragile adherend without damaging and contaminating the fragile adherend.

Another object of the present invention is to provide a method of processing an adherend using the pressure-sensitive adhesive sheet according to the present invention, and to provide an apparatus for stripping the pressure-sensitive adhesive sheet adopted to the processing of the adherend.

Solution to Problem

After intensive investigations to solve the problems and to minimize or reduce the "warping" based on the beam theory in the field of strength of materials, the present inventors found that, when a pressure-sensitive adhesive sheet having a bilayer structure including a base layer X and a pressure-sensitive adhesive layer Y arranged thereon is adopted, a higher rigidity of the base layer constituting the pressure-sensitive adhesive sheet reduces the curvature R of the fragile semiconductor wafer obtained after polishing and suppresses "warping" of the semiconductor wafer even after being polished to be thin. However, the present inventors found that this technique is not a practical solution, because, when the base layer is designed to be thick to have an increased rigidity, it is difficult for the resulting pressure-sensitive adhesive sheet to be affixed to a semiconductor wafer and to be removed from the resulting fragile semiconductor wafer.

Figure 3:
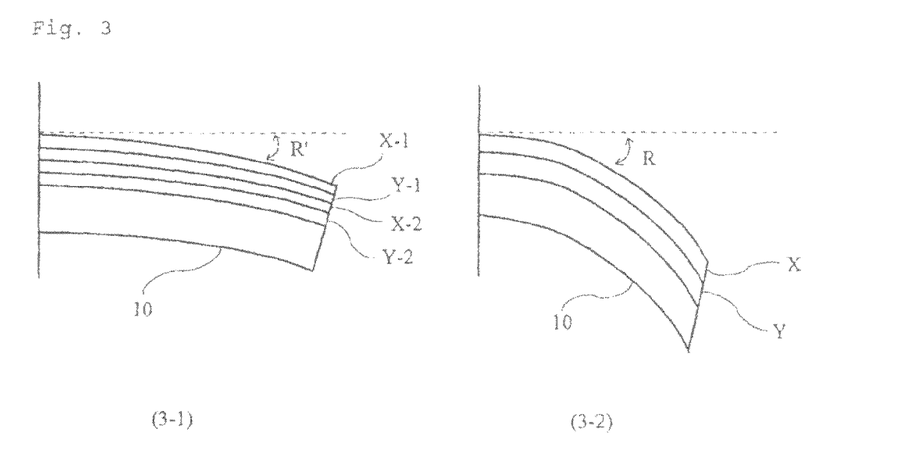
FIG. 3 depicts a side view (3-1) showing a curvature (R') of a semiconductor wafer affixed to the pressure-sensitive adhesive sheet according to the present invention; and a side view (3-2) of a curvature (R) of a semiconductor wafer affixed to a pressure-sensitive adhesive sheet having a bilayer structure.

After further investigations, the present inventors have found that a semiconductor wafer can have a curvature R' less than the above-mentioned curvature R and can be more highly protected from "warping" effectively, by configuring a pressure-sensitive adhesive sheet to have a four-layer structure typically of (base layer (X-1))/(pressure-sensitive adhesive layer (Y-1))/(base layer (X-2))/(pressure-sensitive adhesive layer (Y-2)) and by configuring the multilayer structure of the tape (pressure-sensitive adhesive sheet) to be a predetermined structure (see FIG. 3). They have also found that the advantages are obtained even when the total thickness of the base layers is not increased, i.e., even when the thickness of the base layer X is equal to or larger than the total of the thickness of the base layer (X-1) and the thickness of the base layer (X-2).

In addition, the present inventors have considered that peelability should be imparted to a pressure-sensitive adhesive sheet when the pressure-sensitive adhesive sheet is adopted as a backgrinding tape that is to be stripped from a semiconductor wafer without damaging and contaminating the fragile semiconductor wafer. They have considered that a backgrinding tape meeting the purpose can be obtained by designing the backgrinding tape to have peelability, whereby allowing the backgrinding tape affixed to a semiconductor wafer (adherend) to curve or bend is curved upon the application typically of a heating treatment so that the face affixed to the semiconductor wafer is bowed inward to give a lifting from the adherend to thereby form a peel starting point. This is because the backgrinding tape, which has bent at its periphery and has a lifting from the semiconductor wafer, does not need to be picked up or rubbed to form a peel starting point. In addition, the stripping tape does not need to be affixed up to the edge of the backgrinding tape but has only to be affixed to the backgrinding tape at the interface between a portion curled and lifted up from the semiconductor wafer and a portion where the backgrinding tape is still in intimate contact with the semiconductor wafer. Under this condition, by pulling up the stripping tape to give a peel stress, the peel stress is sufficiently transferred to the backgrinding tape, and the backgrinding tape which has become unnecessary can be thus removed. The peel stress herein can be minimized by pulling the stripping tape while keeping the peel angle as large as possible, and such minimized peel stress minimized the possibility of damaging the fragile semiconductor wafer.

Such small peel stress may also reduce the possibility of transferring the pressure-sensitive adhesive onto the fragile semiconductor wafer through peeling and thereby reduce the possibility of contaminating the fragile semiconductor wafer caused by peeling. In addition, even when adhesion to the member on the polished surface side of the fragile semiconductor wafer occurs, the minimized peel stress can reduce the risk of damaging the wafer.

Based on these, the present inventors have found a pressure-sensitive adhesive sheet whose periphery will curl up from the surface of a semiconductor wafer to form a peel starting point by preparing the pressure-sensitive adhesive sheet using a heat-shrinkable base and devising a scheme of transferring shrinkage forces, generated from the heat-shrinkable base as a result of heating, into a couple of forces.

The present inventors have further found that the pressure-sensitive adhesive sheet having such configuration, when used as a backgrinding tape for an adherend such as a semiconductor wafer and applied to the adherend, can reduce "warping" of the resulting fragile semiconductor wafer even when the semiconductor wafer affixed to the backgrinding tape is polished to be very thin; and that, when the pressure-sensitive adhesive sheet becomes unnecessary, the pressure-sensitive adhesive sheet can be easily stripped from the adherend without contaminating and damaging the adherend, because a peel starting point can be easily formed in the sheet by heating. The present invention as been made based on these findings.

Specifically, the present invention provides, in an embodiment, a pressure-sensitive adhesive sheet which includes a base layer A, a pressure-sensitive adhesive layer A, a base layer B, and a pressure-sensitive adhesive layer B as arranged in this order, in which:

the base layer A is a base layer having such a Young's modulus at 25° C., a Young's modulus at 80° C., and a thickness that the product of the Young's modulus at 25° C. and the thickness is $1.0 \times 10^5$ to $4.0 \times 10^5$ N/m and the product of the Young's modulus at 80° C. and the thickness is $2.8 \times 10^5$ N/m or less;

the pressure-sensitive adhesive layer A is a pressure-sensitive adhesive layer having a shear modulus at 80° C. of 0.2 MPa or less;

the base layer B has such a thickness and a Young's modulus at 25° C. that the product of the Young's modulus at 25° C. and the thickness is smaller than the product, of the base layer A, of the Young's modulus at 25° C. and the thickness, and the base layer B is a heat-shrinkable base layer having, upon 80° C. heating, a shrink percentage in a main shrinkage direction and a shrink percentage in a direction perpendicular to the main shrinkage direction of each 20% or more; and the pressure-sensitive adhesive layer B is a pressure-sensitive adhesive layer having a Young's modulus at 80° C. of 10

MPa or more and having an adhesive strength to a silicon wafer (180-degree peel at a tensile speed of 300 mm/min) of 0.2 N/10 mm or less.

The base layer A preferably has, upon heating to 80° C., a shrink percentage and an expansion coefficient of each 1% or less.

The pressure-sensitive adhesive layer B is preferably an active-energy-ray-curable pressure-sensitive adhesive layer and preferably contains an acrylic polymer containing a (meth)acrylate in its side chain; a crosslinking agent; and an initiator for active-energy-ray-induced polymerization.

In another embodiment, the present invention provides a method of processing an adherend. This method includes the steps of affixing the pressure-sensitive adhesive sheet to an adherend; subjecting the affixed adherend to a predetermined or desired processing; heating the pressure-sensitive adhesive sheet after the processing to thereby allow the pressure-sensitive adhesive sheet to bend so that the surface of the base layer A is bowed inward to give a lifting from the adherend; and stripping the pressure-sensitive adhesive sheet from the adherend.

It is preferred that the pressure-sensitive adhesive sheet includes an active-energy-ray-curable pressure-sensitive adhesive layer as the pressure-sensitive adhesive layer B and that the method includes the steps, of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, and carrying out heating to allow the pressure-sensitive adhesive sheet to bend so that the surface of the base layer A is bowed inward, to thereby form a lifting from the adherend.

The step of stripping the pressure-sensitive adhesive sheet is preferably performed by affixing a stripping tape to a periphery of the surface of the base layer A of the bent pressure-sensitive adhesive sheet; and pulling the stripping tape in a direction opposite to the adherend.

The present invention provides, in still another embodiment, an apparatus for stripping a pressure-sensitive adhesive sheet, which is adopted to the method of processing an adherend and includes irradiation means as an active energy ray source for applying an ultraviolet ray; heating means for heating the pressure-sensitive adhesive sheet affixed to the adherend; and stripping means for stripping the pressure-sensitive adhesive sheet which has been heated and thereby bent so that the surface of the base layer A is bowed inward to give a lifting from the adherend.

Advantageous Effects of Invention

The pressure-sensitive adhesive sheet according to the present invention, when used as a backgrinding tape, allows polishing of an adhered such as a semiconductor wafer as thin as a thickness of about 20 μm to 25 μm without causing "cracking" and "chipping" and protects the resulting fragile semiconductor wafer from "warping". In addition, the pressure-sensitive adhesive sheet according to the present invention, through heating of the wafer after polishing, bends so that the surface of the base layer A is bowed inward (forms a concave face) to give a lifting from the wafer to thereby form a peel starting point. This allows a rectangular stripping tape to be affixed to the pressure-sensitive adhesive sheet not at an end portion of the periphery thereof but at a somewhat inner portion thereof, and the pressure-sensitive adhesive sheet, which becomes unnecessary, can be easily and cleanly stripped off. In addition, the apparatus for stripping a pressure-sensitive adhesive sheet according to the present invention allows smooth stripping and recovering of the pressure-sensitive adhesive sheet according to the present invention from an adherend such as a semiconductor wafer without damaging the adherend, through the steps of applying an active energy ray and heating.

DESCRIPTION OF EMBODIMENTS

Figure 1:
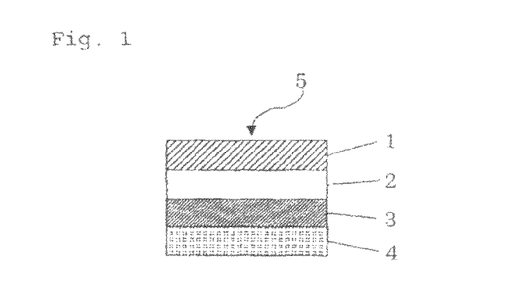
FIG. 1 is a schematic cross-sectional view of a pressure-sensitive adhesive sheet according to an embodiment of the present invention.

Some embodiments of the present invention will be illustrated in detail with reference to the attached drawings according to necessity. FIG. 1 is a schematic cross-sectional view of a pressure-sensitive adhesive sheet according to an embodiment of the present invention; and FIG. 2 is a schematic side view of an apparatus for stripping a pressure-sensitive adhesive sheet according to another embodiment of the present invention.

In the embodiment illustrated in FIG. 1, the pressure-sensitive adhesive sheet (5) according to the present invention includes a base layer A (1) and a base layer B (3) bound to each other through a pressure-sensitive adhesive layer A (2) and further includes a pressure-sensitive adhesive layer B (4) adjacent to the base layer B (3).

Figure 2:
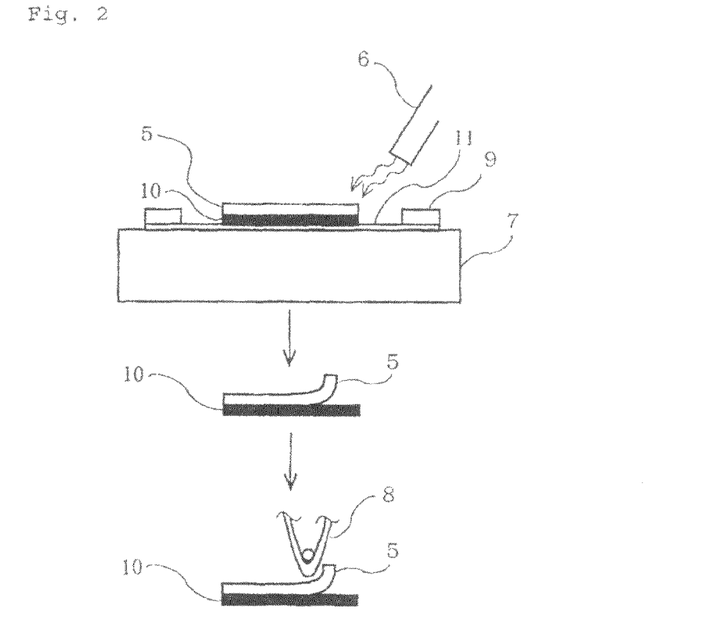
FIG. 2 is a schematic side view of a stripping apparatus according to another embodiment of the present invention.

In the embodiment illustrated in FIG. 2, the stripping apparatus according to the present invention includes heating means or ultraviolet-ray-irradiation means 6, and a stripping tape 8 for recovering a pressure-sensitive adhesive sheet 5, in which the pressure-sensitive adhesive sheet 5 is affixed to a semiconductor wafer 10 which is in turn affixed to a dicing tape 11 arranged on a vacuum chuck stage 7 and fixed by a ring frame 9. The pressure-sensitive adhesive sheet 5 is heated by the heating means 6 to give a lifting from the semiconductor wafer 10 and is then stripped from the semiconductor wafer 10 by affixing the stripping tape 8 from above to the pressure-sensitive adhesive sheet 5 and peeling off the stripping tape 8 together with the pressure-sensitive adhesive sheet 5.

[Pressure-Sensitive Adhesive Sheet]

The pressure-sensitive adhesive sheet according to the present invention has a multilayer structure including a base layer A, a pressure-sensitive adhesive layer A, a base layer B, and a pressure-sensitive adhesive layer B arranged in this order.

[Base Layer A]

The base layer A constitutes an outermost layer of the pressure-sensitive adhesive sheet, should have the function of protecting an adhered from a polishing stress, tailings in polishing, polishing water, and polishing heat applied during polishing of the adherend, and should be able to protect the resulting fragile adherend from "warping" even after being polished to be very thin. The base layer A preferably has excellent mechanical properties, is satisfactorily dimensionally stable against heat, and is chemically stable.

To avoid "warping" of a fragile adherend after being polished to be very thin, the wafer after polishing (adherend)

preferably has a curvature (R') as small as possible. From this viewpoint, regarding the mechanical properties, the base layer A has a product of a Young's modulus at a polishing temperature (e.g., 25° C.) and a thickness of $1.0 \times 10^5$ to $4.0 \times 10^5$ N/m (preferably $1.5 \times 10^5$ to $2.0 \times 10^5$ N/m). If the base layer A has a product of the Young's modulus at 25° C. and the thickness of less than $1.0 \times 10^5$ N/m, the fragile adherend tends to suffer larger "warping" and to thereby be easily damaged or broken. In contrast, if the base layer A has a product of the Young's modulus at 25° C. and the thickness of more than $4.0 \times 10^5$ N/m, the pressure-sensitive adhesive sheet tends to have excessively high rigidity, and this may impede the affixation of the sheet to the adherend. In addition, such pressure-sensitive adhesive sheet having an excessively high rigidity may suffer from a larger elastic deformation force caused by the stress applied upon affixation, and this may often cause larger "warping" of the adherend such as a semiconductor wafer after being polished to be very thin.

Further, the base layer A has a product of a Young's modulus at a peeling temperature (e.g., 80° C.) and a thickness of $2.8 \times 10^5$ N/m or less (preferably $1.0 \times 10^5$ to $2.0 \times 10^5$ N/m). If the base layer A has a product of the Young's modulus at 80° C. and the thickness of more than $2.8 \times 10^5$ N/m, the pressure-sensitive adhesive sheet having the base layer may be difficult to be stripped off from a fragile adherend without damaging the fragile adherend.

As the thermal dimensional stability, the base layer A preferably has a thermal shrink percentage and a thermal expansion coefficient of each preferably 1% or less, and more preferably 0.5% or less, at such a predetermined temperature (e.g., 80° C.) to cause the base layer B to shrink 20% or more in biaxial directions. If the base layer A has, at 80° C., a thermal shrink percentage and a thermal expansion coefficient of both more than 1%, the pressure-sensitive adhesive sheet after heating for peeling may be folded and overlap on the adherend surface, and this may often cause difficulties in peeling or adherend failure.

The base layer A for use in the present invention has a Young's modulus at an adherend polishing temperature (e.g., 25° C.) of preferably $1 \times 10^9$ to $10 \times 10^9$ Pa, and more preferably $1.0 \times 10^9$ to $5.0 \times 10^9$ Pa, in consideration of easiness in operation during production, handleability, and economical efficiency. The base layer A has a Young's modulus at a peeling temperature (e.g., 80° C.) of preferably $3 \times 10^6$ to $2 \times 10^{10}$ Pa and more preferably $1 \times 10^8$ to $1 \times 10^{10}$ Pa. If the base layer A has an excessively low Young's modulus, the fragile adherend after being polished may suffer larger "warping" and may be easily damaged. In contrast, if the base layer A has an excessively high Young's modulus, the pressure-sensitive adhesive sheet may be difficult to be affixed to the adherend. The base layer A has a thickness of preferably less than 100 µm (for example about 5 to about 100 µm) and more preferably about 5 to about 75 µm. If the base layer A has an excessively large thickness, the pressure-sensitive adhesive sheet may be difficult to be affixed to the adherend and may show poor handleability and insufficient economical efficiency, thus being undesirable. In addition, such high rigidity may cause large elastic deformation force induced by the stress upon affixation of the pressure-sensitive adhesive sheet, and this may in turn often cause larger "warping" of the adherend such as a semiconductor wafer after being polished to be thin. When the pressure-sensitive adhesive layer B arranged adjacent to the base layer B is an active-energy-ray-curable pressure-sensitive adhesive layer, and an active energy ray is applied through the base layer A, the base layer A should be made from such a material as to allow the active energy ray to transmit therethrough in a predetermined quantity or more (e.g., a transparent resin).

Preferred exemplary base materials for constituting the base layer A usable herein include polyolefins such as polypropylenes, polyethylenes, and copolymers of them; polyesters such as poly(ethylene terephthalate)s, poly(butylene terephthalate)s, and poly(lactic acid)s; polyimides such as Kapton; polyvinyls such as ethylene-vinyl acetate copolymers and poly(vinyl chloride)s; polyamides such as 6,6-nylon; poly(ether sulfone)s; polynorbornenes; and other polymers transparent with respect to ultraviolet rays. The base material for the base layer A can be appropriately chosen from among these polymers according typically to stripping conditions such as heating condition. Each of such polymers can be used alone or in combination.

The base layer A herein is preferably a base layer made from a polyester and is more preferably a base polymer made from a poly(ethylene terephthalate). This is because such base layer excels in economical efficiency such as cost efficiency and has a high tackiness to the after-mentioned pressure-sensitive adhesive layer A through which the base layer B is to be affixed. In addition, the base layer of this type excels in thermal stability and has a high mechanical strength.

The base layer A herein are also available as commercial products typically under the trade name "Kapton" (supplied by E.I. du Pont de Nemours and Company), the trade name "TORAYFAN" (supplied by Toray Industries Inc.), the trade name "Lumirror" (supplied by Toray Industries Inc.), the trade name "ARTON" (supplied by JSR), the trade name "ZEONOR" (supplied by ZEON CORPORATION), and the trade name "Melinex" (supplied by DuPont Teijin Films, Ltd.). Among them, products under the trade name "Lumirror" (supplied by Toray Industries Inc.) and the trade name "Melinex" (supplied by DuPont Teijin Films, Ltd.) are advantageously employed. Where necessary, these commercial products may be subjected to a treatment such as stretching and/or crosslinking and may independently be subjected to a surface treatment such as corona treatment and/or printing process.

The base layer A for use in the present invention, when laminated with the base layer B to form a laminate, can resist the shrinkage stress of the base layer B, and is capable of protecting the adherend from being damaged upon heating, by avoiding the shrinkage of the laminate while remaining as adhering to the adherend. In addition, the base layer A, when resisting the shrinkage stress of the base layer B, gives a counteracting stress, and this stress acts to convert the shrinkage stress into a couple of forces to thereby promote the deformation of the periphery of the pressure-sensitive adhesive sheet according to the present invention having the base layer A.

[Base Layer B]

The base layer B for use in the present invention plays a role as a source of driving force to allow the pressure-sensitive adhesive sheet having the base layer B, through heating from an arbitrary direction, to bend so that the surface of the base layer A is bowed inward to thereby give a lifting from the adherend. A heat-shrinkable base having biaxial shrinkability is adopted herein as the base layer B, because the resulting pressure-sensitive adhesive sheet can be heated from any arbitrary direction. Specifically, the base layer B has a shrink percentage (%) in a main shrinkage direction (machine direction; MD) and a shrink percentage (%) in a direction perpendicular to the main shrinkage direction (transverse direction; TD) at a predetermined temperature ranging from 70° C. to 250° C. (e.g., 80° C.) of each 20% or more. The base layer B in the present invention can shrink to give a driving force even when heated not only from rectangular two directions but also from any arbitrary direction; and the driving force allows the pressure-sensitive adhesive sheet having the base layer B to bend or curl so that the surface of the base layer A is bowed inward to give a lifting from the adherend to thereby form a peel starting point. This is probably because the base layer B has biaxial shrinkability, and, in fact, shrinkage stresses generated in the two shrinkage axes act together.

If the base layer B has a shrink percentage (%) in a main shrinkage direction and/or a shrink percentage (%) in a direction perpendicular to the main shrinkage direction of less than 20% at 80° C., a pressure-sensitive adhesive sheet having the base layer B may not bend or little bend so that the surface of the base layer A is bowed inward and may fail to form a peel starting point, even when the sheet is heated from arbitrary one direction. This is because the rigidity of the entire pressure-sensitive adhesive sheet exceeds the shrinkage stress. It should be noted that the shrink percentages in the two axial directions may be the same as or different from each other. For example, the base layer B may have a shrink percentage in one axial direction of 20% and a shrink percentage in the other axial direction of 30%; and in this case, an axial direction showing a higher shrink percentage is defined as the main shrinkage direction.

The biaxial shrinkability can be imparted to the base layer B, for example, by applying biaxial stretching to a film extruded by an extruder, and the shrink percentages can be controlled by setting the degrees of stretching appropriately. A heat-shrinkable base material constituting the base layer B herein is preferably one that sufficiently shrinks through heating by heating means of a stripping apparatus so as to allow the pressure-sensitive adhesive sheet having the heat-shrinkable base to form a peel starting point. When the pressure-sensitive adhesive layer B to be arranged on the base layer B is an active-energy-ray-curable pressure-sensitive adhesive layer and when an active energy ray is applied through the base layer B, the base layer B should be made from such a material as to allow the active energy ray to transmit therethrough in a predetermined quantity or more (e.g., a transparent resin).

Preferred exemplary heat-shrinkable base materials for constituting the base layer B usable herein include polyolefin shrinkable base materials such as polypropylenes, polyethylenes, and copolymers of them; polyester shrinkable base materials such as poly(ethylene terephthalate)s, poly(butylene terephthalate)s, and poly(lactic acid)s; shrinkable base materials prepared by stretching chemically stable base materials such as ethylene-vinyl acetate copolymers; and other polymers transparent to ultraviolet rays. The base material for the base layer B can be appropriately chosen from among these polymers according typically to stripping conditions such as heating condition. Each of such polymers can be used alone or in combination.

Among them, polyester shrinkable base materials are preferred to form the base layer B. This is because these base materials have advantages such that the resulting base layer B excels in economical efficiencies such as cost efficiency, shows high tackiness to the pressure-sensitive adhesive layer A through which the base layer A is affixed, and satisfactorily responds at a shrinkage starting temperature.

The base layer B has such a thickness and Young's moduli that the product of the Young's modulus at an adherend polishing temperature (e.g., 25° C.) and the thickness is smaller than that of the base layer A (i.e., the product of the Young's modulus at the same temperature (25° C.) and the thickness) and is typically $1.0 \times 10^4$ to $4.0 \times 10^5$ N/m and preferably $5.0 \times 10^4$ to $2.0 \times 10^5$ N/m. If the base layer B has a product of the Young's modulus at 25° C. and the thickness equal to or larger than that of the base layer A (i.e., the product of the Young's modulus at the same temperature (25° C.) and the thickness), the adherend may often shows a larger curvature (R'). In the present invention, the base layer B has a product of the Young's modulus at 25° C. and the thickness of preferably 80% or less and more preferably from about 10% to about 60% of that of the base layer A (i.e., the product of the Young's modulus at 25° C. and the thickness).

The base layer B has a Young's modulus at an adherend polishing temperature (e.g., 25° C.) of preferably $1 \times 10^9$ to $10 \times 10^9$ Pa and more preferably $1 \times 10^9$ to $4 \times 10^9$ Pa.

The base layer B has a thickness of preferably 5 to 100 µm and more preferably 20 to 80 µm. The base layer B, if having a thickness of less than 5 µm, may show poor operability such as difficulties typically in winding and/or unwinding operation in the production of the film. In contrast, the base layer B, if having a thickness of more than 100 µm, may be not only uneconomical but also have excessively high rigidity and may thereby shrink insufficiently to fail to allow the sheet to bend so that the surface of the base layer A is bowed inward. Additionally, such base layer B having an excessively high rigidity may cause a larger elastic deformation force generated by the stress upon the affixation of the pressure-sensitive adhesive sheet, and this may often cause larger "warping" of an adherend such as a semiconductor wafer after being polished to be thin.

The base layer B in the present invention can be any commercial products typically under the trade name "Spaceclean" (supplied by Toyobo Co. Ltd.), the trade name "SUN-TEC" (supplied by Asahi Kasei Corporation), the trade name "Fancy wrap" (supplied by GUNZE Limited), the trade name "SOPRA" (supplied by SEKISUI FILM CO., LTD.), the trade name "KOHJIN POLYSET" (supplied by KOHJIN Co., Ltd.), and the trade name "TERRAMAC" (supplied by UNITIKA LTD.). Among them, the product under the trade name "Spaceclean" (supplied by Toyobo Co. Ltd.) satisfies the requirements, has large shrink percentages, and is advantageously usable herein. Where necessary, these commercial products may be subjected to a treatment such as stretching and/or crosslinking and/or may be subjected to a surface treatment such as corona treatment and/or printing process. By applying stretching to such base materials, the base materials can have further higher shrink percentages.

The base layer B in the present invention, when laminated with the base layer A to give a laminate, gives driving force which allows the laminate to bend, through heating from arbitrary one direction, so that the surface of the base layer A is bowed inward to give a lifting from the adherend to thereby form a peel starting point. When a pressure-sensitive adhesive sheet having the base layer B is used as a backgrinding tape typically for a semiconductor wafer, the pressure-sensitive adhesive sheet can be affixed to the semiconductor wafer without the need to consider the shrinkage direction of the pressure-sensitive adhesive sheet; and the pressure-sensitive adhesive sheet can form a peel starting point by heating from arbitrary one direction regardless of the direction in which the sheet is affixed to the semiconductor wafer; and the pressure-sensitive adhesive sheet can be easily stripped or peeled off at the peel starting point from the adherend without damaging the fragile adherend.

[Pressure-Sensitive Adhesive Layer A]

The pressure-sensitive adhesive layer A in the present invention preferably has a sufficient bond strength (or adhesive strength) to bond the base layer A and the base layer B with each other. In addition, the pressure-sensitive adhesive layer A preferably has an adequate rigidity to suppress the "warping" of the adhered after being polished to be thin, when the pressure-sensitive adhesive sheet according to the present invention including the base layer A, pressure-sensitive adhesive layer A, and base layer B is used to be affixed to the adherend.

The pressure-sensitive adhesive layer A has a shear modulus at an adherend polishing temperature (e.g., 25° C.) of typically about $5.0 \times 10^4$ to about $5.0 \times 10^6$ Pa and preferably about $1.0 \times 10^5$ to about $1.0 \times 10^6$ Pa. The pressure-sensitive adhesive layer A, if having a shear modulus at 25° C. of less than $5.0 \times 10^4$ Pa, may have an excessively low rigidity, and this may often cause larger "warping" of the fragile adherend. In contrast, the pressure-sensitive adhesive layer A, if having a shear modulus at 25° C. of more than $5.0 \times 10^6$ Pa, may have an excessively high rigidity, and this may cause a larger elastic deformation force generated by the stress upon the affixation of the pressure-sensitive adhesive sheet and may cause larger "warping" of the adherend such as a semiconductor wafer after being polished to be thin.

On the other hand, the pressure-sensitive adhesive layer A preferably has such flexibility or elasticity as to deform appropriately in accordance with the shrinkage of the base layer B, which shrinkage is induced by heating of the pressure-sensitive adhesive sheet for the removal of the sheet. The pressure-sensitive adhesive layer A having suitable flexibility can transfer the shrinkage stress from the base layer B to the base layer A. From this viewpoint, the pressure-sensitive adhesive layer A has, for example, a shear modulus at 80° C. of typically 0.2 MPa or less and preferably 0.01 to 0.2 MPa. The pressure-sensitive adhesive layer A, if having a shear modulus at 80° C. of more than 0.2 MPa, may act to impede the shrinkage of the base layer B upon heating, and the pressure-sensitive adhesive sheet may not bend so that the surface of the base layer A is bowed inward, and this may often impede the formation of a peel starting point. In contrast, the pressure-sensitive adhesive layer A, if having a shear modulus at 80° C. of less than 0.01 MPa, may deform as being forced by the shrinkage of the base layer B, and this may often lead to laminate fracture.

The pressure-sensitive adhesive layer A for use in the present invention has a thickness of preferably 1 to 100 μm and more preferably 5 to 60 μm. The pressure-sensitive adhesive layer A, if having a thickness of less than 1 μm, may show an insufficient bond strength to bond the base layer A and the base layer B with each other and may cause the pressure-sensitive adhesive sheet to have insufficient rigidity, and this may cause larger "warping" of the fragile adherend after polishing. In contrast, the pressure-sensitive adhesive layer A, if having a thickness of more than 100 μm may cause economical disadvantages and may have an excessively high rigidity to thereby suppress or impede the shrinkage of the base layer B upon heating. This may inhibit the pressure-sensitive adhesive sheet from bending so that the surface of the base layer A is bowed inward and may thus impede the formation of a peel starting point.

The pressure-sensitive adhesive layer A has a rigidity (in terms of the product of the shear modulus and thickness) at 80° C. of typically about 1 to about 1000 N/m and preferably 10 to 200 N/m. The pressure-sensitive adhesive layer A, if having a rigidity of less than 1 N/m upon heating to 80° C., may not satisfactorily transfer the shrinkage stress from the base layer B to the base layer A and may deform as being forced by the shrinkage of the base layer B, and, as a result, the pressure-sensitive adhesive sheet may not bend so that the surface of the base layer A is bowed inward, to fail to form a peel starting point. In contrast, the pressure-sensitive adhesive layer A, if having a rigidity of more than 1000 N/m upon heating to 80° C., may generally show an insufficient adhesive strength and may often cause delamination between the base layer B and the pressure-sensitive adhesive layer A, resulting in laminate fracture. In addition, the pressure-sensitive adhesive sheet in this case may have an excessively high rigidity to fail to transfer the shrinkage of the base layer B to the base layer A, and the base layer B alone may deform to give a stress, and this stress may break the adherend.

The pressure-sensitive adhesive layer A relating to the present invention has a bond strength with respect to the base layer A and the base layer B (180° C. peel, at a tensile speed of 300 mm/min) at 80° C. of typically 1 N/10 mm or more and preferably 4 N/mm or more. The pressure-sensitive adhesive layer A, if having a bond strength with respect to the base layer A and the base layer B (180° C. peel, at a tensile speed of 300 mm/min) at 80° C. of less than 1 N/10 mm, may suffer delamination between the base layer A and the base layer B by the action of the shear stress applied upon the cutting of the pressure-sensitive adhesive sheet or may suffer laminate fracture upon thermal shrinkage of the base layer B. Thus, the pressure-sensitive adhesive sheet may fail to bend so that the surface of the base layer A is bowed inward and fail to form a peel starting point.

A pressure-sensitive adhesive for constituting the pressure-sensitive adhesive layer A for use in the present invention can be one or more of known pressure-sensitive adhesives. Examples thereof include rubber pressure-sensitive adhesives containing any of natural rubbers and synthetic rubbers as a base polymer; acrylic pressure-sensitive adhesives containing, as a base polymer, an acrylic polymer (homopolymer or copolymer) composed of one or more monomer components selected from alkyl esters of (meth)acrylic acids (e.g., alkyl esters whose alkyl moiety having 1 to 20 carbon atoms, such as methyl ester, ethyl ester, propyl ester, isopropyl ester, butyl ester, isobutyl ester, s-butyl ester, t-butyl ester, pentyl ester, hexyl ester, heptyl ester, octyl ester, 2-hydroxyethyl ester, 2-ethylhexyl ester, isooctyl ester, isodecyl ester, dodecyl ester, tridecyl ester, pentadecyl ester, hexadecyl ester, heptadecyl ester, octadecyl ester, nonadecyl ester, and eicosyl ester); vinyl alkyl ether pressure-sensitive adhesives; silicone pressure-sensitive adhesives; polyester pressure-sensitive adhesives; polyamide pressure-sensitive adhesives; urethane pressure-sensitive adhesives; styrene-diene block copolymer pressure-sensitive adhesives; and pressure-sensitive adhesives having improved creep properties and corresponding to these pressure-sensitive adhesives, except for further containing a hot-melt resin (thermofusible resin) having a melting point of about 200° C. or below. Such pressure-sensitive adhesives can be found typically in Japanese Unexamined Patent Application Publication (JP-A) No. S56-61468, Japanese Unexamined Patent Application Publication (JP-A) No. S61-174857, Japanese Unexamined Patent Application Publication (JP-A) No. S63-17981, and Japanese Unexamined Patent Application Publication (JP-A) No. S56-13040.

Where necessary, the acrylic polymer may further contain one or more units corresponding to other monomer components copolymerizable with the alkyl(meth)acrylates, in order to improve properties such as cohesive strength, thermal stability, and crosslinking properties. Examples of such monomer components include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as hydroxyethyl(meth)acrylate, hydroxypropyl(meth)acrylate, hydroxybutyl(meth)acrylate, hydroxyhexyl(meth)acrylate, hydroxyoctyl(meth)acrylate, hydroxydecyl(meth)acrylate, hydroxylauryl(meth)acrylate, and (4-hydroxymethylcyclohexyl)methyl methacrylate; sulfo-containing, monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; (N-substituted)amide monomers such as (meth)acrylamide, N,N-dimethyl(meth)acrylamide, N-butyl (meth)acrylamide, N-methylol(meth)acrylamide, and N-methylolpropane(meth)acrylamide; aminoalkyl(meth)acrylate monomers such as aminoethyl(meth)acrylate, N,N-dimethylaminoethyl(meth)acrylate, and t-butylaminoethyl(meth) acrylate; alkoxyalkyl(meth)acrylate monomers such as methoxyethyl(meth)acrylate and ethoxyethyl(meth)acrylate; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylenesuccinimide, N-(meth)acryloyl-6-oxyhexamethylenesuccinimide, and N-(meth)acryloyl-8-oxyoctamethylenesuccinimide; vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxamides, styrene, α-methylstyrene, and N-vinylcaprolactam; cyano acrylate monomers such as acrylonitrile and methacrylonitrile; epoxy-containing acrylic monomers such as glycidyl(meth)acrylate; glycol acrylate monomers such as polyethylene glycol(meth)acrylates, polypropylene glycol (meth)acrylates, methoxyethylene glycol(meth)acrylate, and methoxypolypropylene glycol(meth)acrylate; acrylate monomers each having, for example, a heterocycle, a halogen atom, or silicon atom, such as tetrahydrofurfuryl(meth)acrylate, fluorine(meth)acrylates, and silicone(meth)acrylates; multifunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri (meth)acrylate, pentaerythritol tri(meth)acrylate, dipentaerythritol hexa(meth)acrylate, epoxy acrylates, polyester acrylates, urethane acrylates, and butanediol di(meth)acrylate; olefinic monomers such as isoprene, butadiene, and isobutylene; and vinyl ether monomers such as vinyl ethers. Each of such monomer components can be used alone or in combination as a mixture.

The acrylic copolymer can be prepared by subjecting the monomer components to polymerization. The polymerization of the monomer components can be performed according to a customary procedure such as solution polymerization, emulsion polymerization, bulk polymerization, or suspension polymerization.

The pressure-sensitive adhesive may further contain other components in addition to the pressure-sensitive adhesive component (base polymer). Examples of such other components include crosslinking agents such as polyisocyanates and alkyl-etherified melamine compounds; tackifiers such as rosin derivative resins, polyterpene resins, petroleum resins, and oil-soluble phenol resins; plasticizers; fillers; age inhibitors; and other suitable additives. Independently, the pressure-sensitive adhesive may further contain glass beads or resin beads. The addition of such glass or resin beads may facilitate the control of pressure-sensitive adhesive properties and shear moduli.

The pressure-sensitive adhesive layer A in the present invention can be formed according to a known or customary process. Typically, the pressure-sensitive adhesive layer A can be formed, for example, a process of preparing a coating composition containing the pressure-sensitive adhesive and other components using a solvent according to necessity, and applying the coating composition directly to a base layer; or a process of applying the coating composition to a suitable separator (e.g., release paper) to form a pressure-sensitive adhesive layer A, and transferring the formed layer to a base layer. In the case of the transfer process, a void (gap) may remain in the interface with the base layer. In this case, the void may be diffused and removed by a heating/pressurizing process typically through an autoclave treatment. The pressure-sensitive adhesive layer A may have a single-layer structure or multilayer structure.

[Pressure-Sensitive Adhesive Layer B]

The pressure-sensitive adhesive layer B for use in the present invention is preferably such that it firmly adheres to an adherend such as a semiconductor wafer during the step of polishing the adherend and thereby protects the adherend from being damaged during polishing, and, after the completion of the polishing process, it shows a remarkably reduced adhesive strength and is thereby easily removed from the surface of the adherend.

For this reason, upon stripping of the pressure-sensitive adhesive sheet, the pressure-sensitive adhesive layer B should show a low adhesive strength with respect to the adherend to thereby allow the pressure-sensitive adhesive sheet to be stripped easily from the adherend. In addition, the pressure-sensitive adhesive layer B should have such rigidity as to resist or repulse the shrinkage, through heating, of the base layer B. To meet these, the pressure-sensitive adhesive layer B has a Young's modulus at 80° C. 10 MPa or more and an adhesive strength with respect to a silicon wafer (180-degree peel at a tensile speed of 300 mm/min) of 0.2 N/10 mm or less. By this configuration, upon heating to 80° C., the pressure-sensitive adhesive layer A has a low shear modulus and thereby deforms rapidly so as to relax the shrinkage stress of the base layer B, whereas the pressure-sensitive adhesive layer B has a high Young's modulus and is thereby resistant to deformation, and this induces a counteracting force against the shrinkage of the base layer B so as to lift the base layer B perpendicularly from the adherend surface. Thus, the pressure-sensitive adhesive sheet bends at its periphery so that the surface of the base layer A is bowed inward to give a lifting from the adherend to thereby form a peel starting point.

The pressure-sensitive adhesive layer B has a Young's modulus at 80° C. of 10 MPa or more and preferably 15 MPa or more (e.g., 15 to 100 MPa). The pressure-sensitive adhesive layer B, if having a Young's modulus at 80° C. of less than 10 MPa, may show an excessively low counteracting force against the shrinkage of the base layer B, and this may lower the force to lift the base layer B perpendicularly from the adherend surface. Thus, the pressure-sensitive adhesive sheet may fail to bend at its periphery so that the surface of the base layer A is bowed inward and lifts from the adherend, and this may impede the formation of a peel starting point.

The pressure-sensitive adhesive layer B has an adhesive strength at 80° C. with respect to a silicon wafer (180-degree peel at a tensile speed of 300 mm/min) of 0.2 N/10 mm or less. This allows the pressure-sensitive adhesive sheet to be easily stripped off from the adherend by heating to 80° C. without damaging the fragile adherend.

Independently, the pressure-sensitive adhesive layer B has an adhesive strength at 25° C. with respect to a silicon wafer (180-degree peel at a tensile speed of 300 mm/min) of preferably 0.5 N/10 mm or more. This is because the pressure-sensitive adhesive sheet in the polishing process of an adherend desirably firmly adheres to the adherend to protect the adherend.

The pressure-sensitive adhesive layer B has a thickness of preferably 1 to 100 µm and more preferably 5 to 60 µm. The pressure-sensitive adhesive layer B, if having a thickness of less than 1 µm, may give an insufficient adhesive force to bond between the pressure-sensitive adhesive sheet and the adherend and may cause larger "warping" of the fragile adherend after polishing. In contrast, the pressure-sensitive adhesive layer B, if having a thickness of more than 100 µm, may not only cause economical disadvantages but also have an excessively high rigidity to suppress the shrinkage of the base layer B upon heating. This may impede the warping of the pressure-sensitive adhesive sheet so that the surface of the base layer A is bowed inward and may impede a lifting from the adherend, resulting in difficulty in the formation of a peel starting point.

The pressure-sensitive adhesive layer B should satisfy the above conditions and preferably has such an adhesive strength with respect to a silicon wafer as to vary between in the polishing process of the adherend (at 25° C.) and in the stripping of the pressure-sensitive adhesive sheet (at 80° C.). The pressure-sensitive adhesive layer B may have such a varying adhesive strength, for example, by using an active-energy-ray-curable pressure-sensitive adhesive or by using a self-adhesive pressure-sensitive adhesive.

An active-energy-ray-curable pressure-sensitive adhesive layer, when used as the pressure-sensitive adhesive layer, can reduce its adhesive strength upon the application of an active energy ray. On the other hand, a self-adhesive pressure-sensitive adhesive, when used in the pressure-sensitive adhesive layer, can reduce its adhesive strength through heating, by modifying the parameters such as the composition and additives of the self-adhesive pressure-sensitive adhesive. Among such pressure-sensitive adhesives, an active-energy-ray-curable pressure-sensitive adhesive is preferably used in the pressure-sensitive adhesive layer B, because its adhesive strength can vary through the application of an active energy ray.

Exemplary active-energy-ray-curable pressure-sensitive adhesives for constituting an active-energy-ray-curable pressure-sensitive adhesive layer used as the pressure-sensitive adhesive layer include pressure-sensitive adhesives containing an acrylic pressure-sensitive adhesive as a base polymer and further containing an active-energy-ray-curable compound; and acrylic pressure-sensitive adhesives whose base polymer has been imparted with curability upon the application of an active energy ray.

As the active-energy-ray-curable compound to be further contained in the pressure-sensitive adhesives containing an acrylic pressure-sensitive adhesive as a base polymer, preferred are compounds each having, per molecule, two or more functional groups having a carbon-carbon multiple bond, such as vinyl group, methacrylic group, and acetylene group. The functional groups having a carbon-carbon multiple bond contained in these compounds undergo cleavage of the bonds upon the application of an active energy ray to form free radicals, and the free radicals act as a crosslinking agent to form a three-dimensional network structure. As the active-energy-ray-curable compound, also preferred is a combination use of an organic salt and a compound having two or more heterocycles as functional groups. Exemplary organic salts include iodonium salts, phosphonium salts, antimonium salts, sulfonium salts, and borate salts. Exemplary heterocycles include oxirane, oxetane, oxolane, thiirane, and aziridine. In such combination, the organic salt is cleaved by the application of an active energy ray to generate an ion, and the ion serves as an initiating agent to induce a ring-opening reaction of the heterocycles of the compound, thereby forming a three-dimensional network structure.

Of active-energy-ray-curable compounds for use in the present invention, preferred are active-energy-ray-curable compounds each having, per one molecule, two or more functional groups containing a carbon-carbon double bond, such as acrylate groups (see Japanese Unexamined Patent Application Publication (JP-A) No. 2003-292916). This is because such acrylate groups show relatively high reactivity with respect to active energy rays, have a wide range of selectivity as various acrylic pressure-sensitive adhesives, and are thereby desirable from the viewpoints of reactivity and workability. Exemplary active-energy-ray-curable compounds containing two or more carbon-carbon double bonds per one molecule include trimethylolpropane tri(meth)acrylate, pentaerythritol tri(meth)acrylate, pentaerythritol tetra(meth)acrylate, dipentaerythritol monohydroxy(meth)acrylate, dipentaerythritol hexa(meth)acrylate, 1,4-butylene glycol di(meth)acrylate, tetraethylene glycol di(meth)acrylate, 1,6-hexanediol(meth)acrylate, neopentyl glycol di(meth)acrylate, esters between (meth)acrylic acid and a polyhydric alcohol, ester acrylate oligomers, 2-propenyl-3-butenyl cyanurate, isocyanurate, and isocyanurate compounds. Each of such active-energy-ray-curable compounds can be used alone or in combination.

Though not critical, the pressure-sensitive adhesive may contain the active-energy-ray-curable compound in an amount of typically about 0.5 to about 200 parts by weight and preferably about 1 to about 50 parts by weight, per 100 parts by weight of the acrylic copolymer in the pressure-sensitive adhesive. The pressure-sensitive adhesive, if containing the active-energy-ray-curable compound in an amount of more than 200 parts by weight per 100 parts by weight of the acrylic copolymer, may contain excessively large amounts of low-molecular-weight materials and thereby may cause the pressure-sensitive adhesive sheet to show insufficient bond strength to the adherend. In contrast, the pressure-sensitive adhesive, if containing the active-energy-ray-curable compound in an amount of less than 0.5 part by weight per 100 parts by weight of the acrylic copolymer, may give a pressure-sensitive adhesive layer B having such an adhesive strength to an adherend that does not sufficiently vary even with the application of an active energy ray. It should be noted that the active-energy-ray-curable compound can have any viscosity.

Exemplary acrylic pressure-sensitive adhesives whose base polymer has been imparted with curability upon the application of an active energy ray include acrylic pressure-sensitive adhesives containing, in side chain, a functional group having a carbon-carbon double bond. Such an acrylic pressure-sensitive adhesive containing, in its side chain, (meth)acrylate group or another functional group having a carbon-carbon double bond can be obtained, for example, by binding an isocyanate compound (e.g., acryloyloxyethyl isocyanate or methacryloyloxyethyl isocyanate) via a urethane bond to an acrylic polymer having hydroxyl group in its side chain. Exemplary main monomers for constituting the acrylic polymer include alkyl(meth)acrylates such as methyl(meth)acrylate, ethyl(meth)acrylate, butyl(meth)acrylate, isoamyl(meth)acrylate, n-hexyl(meth)acrylate, 2-ethylhexyl(meth)acrylate, isooctyl(meth)acrylate, isononyl(meth)acrylate, decyl(meth)acrylate, and dodecyl(meth)acrylate. Each of such monomer components can be used alone or in combination.

Where necessary, the acrylic polymer may further contain one or more units corresponding to other monomer components copolymerizable with the alkyl(meth)acrylate, in order to improve properties such as cohesive strength, thermal stability, and crosslinking properties. Preferred examples of such monomer components include vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxamides, styrene, $\alpha$-methylstyrene; and N-vinylcaprolactam.

The acrylic polymer may further contain units corresponding to further other monomer components for improving the adhesiveness. Examples of such further other monomer components include carboxyl-containing monomers such as acrylic acid, methacrylic acid, carboxyethyl acrylate, carboxypentyl acrylate, itaconic acid, maleic acid, fumaric acid, and crotonic acid; hydroxyl-containing monomers such as 2-hydroxyethyl(meth)acrylate, 2-hydroxypropyl(meth)acrylate, 4-hydroxybutyl(meth)acrylate, hydroxyhexyl(meth)acrylate, hydroxyoctyl(meth)acrylate, hydroxydecyl(meth)acrylate, hydroxylauryl(meth)acrylate, and (4-hydroxymethylcyclohexyl)methyl methacrylate; (N-substituted) amide monomers such as (meth)acrylamide, N,N-dimethyl(meth)acrylamide, N-butyl(meth)acrylamide, N-methylol(meth)acrylamide, N-methylolpropane(meth)acrylamide, and morpholyl acrylate; cyano acrylate monomers such as acrylonitrile and methacrylonitrile; epoxy-containing acrylic monomers such as glycidyl(meth)acrylate; and tertiary-amino-containing monomers such as dimethylaminoethyl(meth)acrylate, diethylaminoethyl(meth)acrylate, and dimethylaminopropyl(meth)acrylate. Each of such monomer components can be used alone or in combination.

When an acrylic pressure-sensitive adhesive whose base polymer has been imparted with curability with an active energy ray is used as a base polymer constituting the pressure-sensitive adhesive layer B, there is no need of further adding an active-energy-ray-curable compound separately to the base polymer, but the addition is acceptable herein. The pressure-sensitive adhesive layer B, when composed of such acrylic pressure-sensitive adhesive whose base polymer having been imparted with curability with an active energy ray can have a stable layer structure, because this pressure-sensitive adhesive layer B contains none or not so large amounts of active-energy-ray-curable compounds as low-molecular-weight components and thereby does not suffer from the migration of active-energy-ray-curable compounds and other low-molecular-weight components in the pressure-sensitive adhesive layer with time.

To constitute the pressure-sensitive adhesive layer B, acrylic pressure-sensitive adhesives whose base polymer having been imparted with curability with an active energy ray are preferred, because the elasticity of the resulting pressure-sensitive adhesive layer B can be easily controlled through the application of an active energy ray. Among them, acrylic pressure-sensitive adhesives containing, in their side chains, (meth)acrylates or other functional groups having a carbon-carbon double bond are preferred.

The pressure-sensitive adhesive layer B preferably further contains one or more initiators for active-energy-ray-induced polymerization, in order to improve the reaction rate for forming the three-dimensional network structure. The initiators for active-energy-ray-induced polymerization for use herein can be chosen according to the type of the active energy ray to be used (e.g., infrared rays, visual light, ultraviolet rays, radiation, and electron beams) from among known or customary polymerization initiators. Of such initiators, compounds that can initiate photopolymerization by the action of an ultraviolet ray are preferred from the viewpoint of working efficiency. Representative examples of initiators for active-energy-ray-induced polymerization include, but are not limited to, ketone initiators such as benzophenone, acetophenone, quinone, naphthoquinone, anthraquinone, and fluorenone; azo initiators such as azobisisobutyronitrile; and peroxide initiators such as benzoyl peroxide and perbenzoic acid. Such initiators are also available as commercial products typically under the trade names "IRGACURE 184" and "IRGACURE 651" supplied by Ciba Japan (now part of BASF Japan Ltd.).

Each of different initiators for active-energy-ray-induced polymerization can be used alone or in combination as a mixture. The pressure-sensitive adhesive may contain initiators for active-energy-ray-induced polymerization in an amount of typically about 0.01 to about 10 parts by weight, per 100 parts by weight of the acrylic copolymer constituting the pressure-sensitive adhesive. Such initiators for active-energy-ray-induced polymerization may be used in combination with one or more promoters for active-energy-ray-induced polymerization.

The pressure-sensitive adhesive layer B preferably further contain one or more crosslinking agents such as polyisocyanates and alkyl-etherified melamine compounds. The pressure-sensitive adhesive layer, when containing crosslinking agents, can be easily controlled on its cohesiveness and anchoring properties to the base layers. The pressure-sensitive adhesive layer may further contain glass or resin beads. The pressure-sensitive adhesive layer, when containing glass or resin beads, can have a higher Young's modulus and can easily show a reduced adhesive strength. The pressure-sensitive adhesive layer may further contain any of suitable additives including tackifiers such as rosin derivative resins, polyterpene resins, petroleum resins, and oil-soluble phenol resins; plasticizers; thickeners; fillers; and age inhibitors.

The pressure-sensitive adhesive layer B can be formed according to an appropriate process, and examples of such processes include a dry coating process, a dry lamination process, and a coextrusion process. In the dry coating process, a coating composition is applied to the base layer B, which coating composition contains the materials for the formation of the pressure-sensitive adhesive layer, such as natural rubber, a synthetic rubber, or a synthetic resin having rubber-elasticity. In the dry lamination process, the coating composition is applied to a suitable separator (e.g., release paper) to form a pressure-sensitive adhesive layer and this layer is transferred or moved to the base layer B. In the coextrution process, the coating composition is coextruded with a resin composition containing materials constituting the base layer B. In the case of the transfer process (dry lamination process), a void (gap) may remain in the interface with the base layer B. In this case, the void may be diffused and removed by a heating/pressurizing process typically through an autoclave treatment. The pressure-sensitive adhesive layer may have a single-layer structure or multilayer structure.

The pressure-sensitive adhesive layer B suppresses the "warping" of a fragile adherend even after being polished to be thin. After the completion of the polishing step of the adherend, the pressure-sensitive adhesive sheet according to the present invention including the pressure-sensitive adhesive layer B can be easily stripped off from the adherend by applying, for example, a heating treatment to the pressure-sensitive adhesive sheet, thereby allowing the pressure-sensitive adhesive sheet to bend at its periphery so that the surface of the base layer A is bowed inward. Thus, the pressure-sensitive adhesive sheet shows a lifting from the adherend and thereby forms a peel starting point.

The pressure-sensitive adhesive sheet according to the present invention is formed by bonding the base layer A and the base layer B with each other through the pressure-sensitive adhesive layer A, and arranging the pressure-sensitive adhesive layer B adjacent to the base layer B. The pressure-sensitive adhesive sheet according to the present invention may be protected before use by a separator (release liner) applied to the surface of the pressure-sensitive adhesive layer. The pressure-sensitive adhesive sheet may further include intermediate layers such as an undercoat layer and/or another ply of pressure-sensitive adhesive layer A.

When an adherend such as a semiconductor wafer is to be processed, the pressure-sensitive adhesive sheet according to the present invention adheres to and fixes the adherend and allows a predetermined or necessary processing to be performed on the adherend without damaging the adherend. The pressure-sensitive adhesive sheet according to the present application allows the fragile adherend after being processed to have a smaller curvature (R') and thereby to be suppressed from "warping", without adversely affecting the workability typically in an application operation of the pressure-sensitive adhesive sheet to the adherend and a peeling operation of the pressure-sensitive adhesive sheet from the adherend. The reduction in curvature (R') can be achieved without setting the pressure-sensitive adhesive sheet to have a higher rigidity than those of customary pressure-sensitive adhesive sheets. After applying the predetermined processing to the adherend, the pressure-sensitive adhesive sheet is heated from an arbitrary one direction (when an active-energy-ray-curable pressure-sensitive adhesive layer is used as the pressure-sensitive adhesive layer, the pressure-sensitive adhesive sheet is irradiated with an active energy ray and then heated), and the pressure-sensitive adhesive layer shows a remarkably decreased adhesive strength and the base layer B shrinks, whereby the pressure-sensitive adhesive sheet bends and is peeled off from the adherend at its periphery to give a lifting from the adherend to thereby form a peel starting point. Thereafter a stripping tape is affixed to the formed peel starting point and then pulled up, thus the pressure-sensitive adhesive sheet can be very easily removed from the adherend surface without damaging the fragile adherend and without contaminating the adherend due to insufficient removal.

[Separator]

The pressure-sensitive adhesive sheet according to the present invention may further include a separator (release liner) on the surface of the pressure-sensitive adhesive layer B from the viewpoints typically of protection of the pressure-sensitive adhesive layer surface and prevention of blocking. The separator will be removed when the pressure-sensitive adhesive sheet is applied to the adherend. The separator for use herein is not particularly limited and can be chosen typically from among known or customary release papers. Examples of such separators include base materials having a release layer; low-adhesive base materials made from fluorocarbon polymers; and low-adhesive base materials made from nonpolar polymers. Exemplary base materials having a release layer include plastic films and papers whose surface has been treated with a release agent such as a silicone release agent, a long-chain alkyl release agent, a fluorine-containing release agent, or molybdenum sulfide. Exemplary fluorocarbon polymers include polytetrafluoroethylenes, polychlorotrifluoroethylenes, poly(vinyl fluoride)s, poly(vinylidene fluoride)s, tetrafluoroethylene/hexafluoropropylene copolymers, and chlorofluoroethylene/vinylidene fluoride copolymers. Exemplary nonpolar polymers include olefinic resins such as polyethylenes and polypropylenes.

[Method of Processing Adherend]

The method of processing an adherend according to an embodiment of the present invention includes the steps of affixing the pressure-sensitive adhesive sheet to an adherend; subjecting the affixed adherend to a predetermined processing; heating the pressure-sensitive adhesive sheet after the processing to thereby allow the pressure-sensitive adhesive sheet to bend so that the surface of the base layer A is bowed inward to give a lifting from the adherend; and stripping or removing the pressure-sensitive adhesive sheet from the adherend.

Examples of the adherend include semiconductor wafers made of materials such as silicon and gallium arsenide; semiconductor packages; glass; and ceramics. Examples of the processing to be applied to the adherend include grinding, cutting, polishing, mirror polishing, etching, turning, and heating (the heating is limited to one performed at a temperature lower than the heat-shrinkage starting temperature of the base layer B). The processing is, however, not limited, as long as being one that can be performed using the pressure-sensitive adhesive sheet. The pressure-sensitive adhesive sheet according to the present invention has functions of being affixed to the surface of an adherend such as a semiconductor wafer and protecting the semiconductor wafer surface from stress, grinding water, and grinding sludge (silicon dust) during a processing, such as polishing, being applied to the adherend temporarily fixed by the pressure-sensitive adhesive sheet. The pressure-sensitive adhesive sheet according to the present invention, when used as a backgrinding tape, can suppress "warping" of the fragile adherend after being polished to be very thin. After the predetermined processing is applied to the adherend, the pressure-sensitive adhesive sheet is removed and recovered from the adherend.

The way to heat the pressure-sensitive adhesive sheet can be chosen according to the necessity in stripping operation. Typically, the pressure-sensitive adhesive sheet may be heated from an arbitrary one direction to form a peel starting point in a part of the periphery of the pressure-sensitive adhesive sheet; or the entire pressure-sensitive adhesive sheet may be heated to form a peel starting point in the entire periphery of the adherend. The heating of the pressure-sensitive adhesive sheet may be performed at a heating temperature for a heating duration both adequately controlled depending on the heat shrinkability of the base layer B used. For example, the heating is performed at a temperature of typically about 70° C. to about 180° C. and preferably 70° C. to 140° C. for a duration of typically about 5 to about 180 seconds.

When using the pressure-sensitive adhesive sheet according to the present invention as a backgrinding tape for an adherend such as a semiconductor wafer, and heating the pressure-sensitive adhesive sheet after the application of a processing such as polishing to the adherend, the pressure-sensitive adhesive sheet bends so that the surface of the base layer A is bowed inward to give a lifting from the adherend to thereby form a peel starting point. The heating herein can be performed in or from any arbitrary direction without limitation. The pressure-sensitive adhesive sheet after heating does not suffer folding and overlapping on the surface of the adherend such as a semiconductor wafer, and the peeling thereof can be performed without difficulties.

When a pressure-sensitive adhesive sheet including an active-energy-ray-curable pressure-sensitive adhesive layer as the pressure-sensitive adhesive layer B is used as the pressure-sensitive adhesive sheet, the processing method preferably includes the steps of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, subsequently heating the pressure-sensitive adhesive sheet to allow the sheet to bend so that the surface of the base layer A is bowed inward to give a lifting from the adherend. The application of an active energy ray to the active-energy-ray-curable pressure-sensitive adhesive layer allows the pressure-sensitive adhesive layer B, which has firmly adhered to the adherend, to have a significantly reduced adhesive strength, and the pressure-sensitive adhesive sheet can be further easily stripped off from the adherend. Accordingly, by applying an active energy ray and subsequently applying heat to the pressure-sensitive adhesive sheet after the processing of the adherend, the pressure-sensitive adhesive sheet can more efficiently deform (bend so that the surface of the base layer A is bowed inward to give a lifting from the adherend) through heating.

The application of an active energy ray is performed under conditions, such as irradiation intensity and irradiation time, which are not critical and can be set appropriately according to necessity. For example, an ultraviolet ray, when used as the active energy ray, is applied at an irradiation energy of about 50 to about 2000 mJ/cm$^2$ for a duration of about 1 to about 180 seconds.

After the pressure-sensitive adhesive sheet bends so that the surface of the base layer A is bowed inward, the pressure-sensitive adhesive sheet is preferably stripped off from the adherend by applying a stripping tape to the bent pressure-sensitive adhesive sheet at a periphery of the surface of the base layer A, and pulling up the stripping tape. In this process, the pressure-sensitive adhesive sheet according to the present invention can be easily stripped off even when the stripping tape is applied not from the periphery of the pressure-sensitive adhesive sheet toward the center part thereof, because the pressure-sensitive adhesive sheet has deformed and has been peeled off (lifted) from the periphery of the adherend by about 5 to 15 mm. For example, the pressure-sensitive adhesive sheet can be easily stripped off even when the stripping tape is applied to the pressure-sensitive adhesive sheet from a portion about 4 mm inside of the periphery of the sheet toward the center part of the sheet. This prevents the deposition (attachment) of the stripping tape typically to the apparatus upon the application of the stripping tape to the pressure-sensitive adhesive sheet and protects the adherend such as a semiconductor wafer from being damaged upon peeling. The pressure-sensitive adhesive sheet lifts up at its periphery from the adherend, and this keeps the peel angle upon peeling to be as large as possible, whereby allows the peel stress to be as small as possible to prevent the adherend from being damaged. In addition, such small peel stress also reduces the possibility of contaminating the adherend by peeling, since the possibility of the pressure-sensitive adhesive being transferred onto the adherend by peeling is also reduced. In addition, even when the stripping tape adheres to the adherend, such minimized peel stress can reduce the risk of damaging the adherend.

[Stripping Apparatus]

The apparatus for stripping a pressure-sensitive adhesive sheet according to an embodiment of the present invention is an apparatus for stripping a pressure-sensitive adhesive sheet adopted to the method of processing an adherend, and includes irradiation means as an active energy ray source for applying an ultraviolet ray; heating means for heating the pressure-sensitive adhesive sheet affixed to the adherend; and stripping means for stripping the pressure-sensitive adhesive sheet which has been heated, bent so that the surface of the base layer A is bowed inward, and lifted from the adherend.

The apparatus for stripping a pressure-sensitive adhesive sheet, according to the present invention, may further include other means (devices) such as affixing means for affixing a dicing tape and fixing means for fixing the wafer after polishing. The stripping apparatus may include these means as integrated or may include independent devices for respective means.

The irradiation means as an active energy ray source for applying an ultraviolet ray is not limited, as long as being capable of applying an active energy ray (ultraviolet ray) so as to cure an active energy ray (ultraviolet ray)-curable pressure-sensitive adhesive constituting the pressure-sensitive adhesive sheet according to the present invention. Examples of the irradiation means usable herein include ultraviolet ray irradiation devices using a light source that can efficiently emit an ultraviolet ray, such as medium-/high-pressure mercury lamps, UV laser systems, and ultraviolet emitting diodes (UVLEDs).

The heating means is not limited, as long as being capable of heating the processed adherend such as a wafer after polishing to allow the pressure-sensitive adhesive sheet to give a lifting from the surface of the adherend such as a semiconductor wafer. Examples of the heating means usable herein include devices that can heat the pressure-sensitive adhesive sheet rapidly to a shrinkage starting temperature of the base layer B, including noncontact heating devices such as dryers, heat guns, and infrared lamps; a heating device as a heat source mounted in the chuck stage for fixing the adherend; and contact heating devices such as heat rollers.

The heating is enough to be performed so that a periphery of the pressure-sensitive adhesive sheet can be heated from an arbitrary one direction. Typically, after the polishing of a semiconductor wafer, the heating may be applied to only one of the pressure-sensitive adhesive sheet surface and the semiconductor wafer surface or be applied to the both surfaces. The heating temperature is not critical, as long as being such a temperature that the base layer B shrinks, and is typically about 70° C. to about 100° C.

The heating allows the pressure-sensitive adhesive sheet to bend so that the surface of the base layer A is bowed inward to give a lifting from the adherend. After this, the stripping means for stripping the pressure-sensitive adhesive sheet strips off the pressure-sensitive adhesive sheet from the adherend such as the semiconductor wafer. Examples of the stripping means for stripping the pressure-sensitive adhesive sheet include a stripping tape, in which the stripping tape is affixed to the surface of the base layer A at a portion where the lifting from the adherend is formed, of the pressure-sensitive adhesive sheet which has bent so that the surface of the base layer A is bowed inward, and the stripping tape together with the pressure-sensitive adhesive sheet are peeled off from the adherend; a vacuum collet, in which the vacuum collet is suctioned onto a portion, where the lifting from the adherend is formed, of the pressure-sensitive adhesive sheet which has bent so that the surface of the base layer A is bowed inward, and the vacuum collet is pulled to strip off the pressure-sensitive adhesive sheet from the adherend; and a robot arm, in which the robot arm picks up a portion, where the lifting from the adherend is formed, of the pressure-sensitive adhesive sheet which has bent so that the surface of the base layer A is bowed inward, and the robot arm pulls the picked up portion to strip off the pressure-sensitive adhesive sheet from the adherend. Of these, the apparatus for stripping a pressure-sensitive adhesive sheet, according to the present invention, preferably employs a stripping tape to peel off the pressure-sensitive adhesive sheet.

The fixing means for fixing the wafer after polishing is not limited, as long as it fixes and thereby protects the adherend from misregistration caused typically by stresses applied from various operations performed in a series of steps or processes up to the recovery of the pressure-sensitive adhesive sheet according to the present invention from the adherend (e.g., semiconductor wafer). For example, the wafer after polishing may be temporarily fixed typically by a chuck table using static electricity or atmospheric pressure; or may be fixed permanently by applying, to the adherend, a pressure-sensitive adhesive coated on a carrier having a sufficient rigidity to fix the adherend; or may be fixed by affixing a material to the adherend, which material is necessary after the pressure-sensitive adhesive sheet according to the present invention is removed from the adherend, and examples of such material include a dicing tape with a die attach film. A device for fixing the adherend may have such a mechanism as to move from one adherend to another in or among devices necessary for the stripping operation.

The apparatus for stripping a pressure-sensitive adhesive sheet, according to the present invention, allows the pressure-sensitive adhesive sheet according to the present invention to be smoothly stripped off and recovered from an adherend such as a semiconductor wafer without contaminating and/or damaging the adherend, in which the pressure-sensitive adhesive sheet has been affixed to the surface of the adherend such as the semiconductor wafer in order to protect the adherend during a processing step of the adherend, and becomes unnecessary after the completion of the processing step of the adherend.

EXAMPLES

The present invention will be illustrated in further detail with reference to several working examples below. It should be noted, however, that these examples are never construed to limit the scope of the present invention.

Bases used in examples and comparative examples are shown below.
[Bases]

Poly(ethylene terephthalate) film (supplied by Toray Industries Inc. under the trade name "Lumirror S10"; hereinafter also referred to as "Lumirror S10")

Poly(ethylene terephthalate) film (thickness: 100 μm, supplied by DuPont Teijin Films, Ltd. under the trade name "Melinex"; hereinafter also referred to as "Melinex")

Biaxially oriented polyester film (thickness: 30 μm, supplied by Toyobo Co. Ltd. under the trade name "Spaceclean S7200"; hereinafter also referred to as "Spaceclean S7200")

Biaxially oriented polyester film (thickness: 60 μm, supplied by Toyobo Co. Ltd. under the trade name "Spaceclean S5630"; hereinafter also referred to as "Spaceclean S5630")

Production Example 1-1

A pressure-sensitive adhesive A-1 was prepared by reacting 100 parts by weight of a polycarbonatediol (supplied by Daicel Chemical Industries, Ltd. under the trade name "PLACCEL CD220PL") and 10 parts by weight of sebacic acid to give an ester polymer, and mixing 100 parts by weight of the ester polymer with 2 parts by weight of a crosslinking agent (supplied by Nippon Polyurethane Industry Co., Ltd. under the trade name "CORONATE L").

Production Example 1-2

A pressure-sensitive adhesive A-2 was prepared by reacting 100 parts by weight of a polycarbonatediol (supplied by Daicel Chemical Industries, Ltd. under the trade name "PLACCEL CD220PL") and 10 parts by weight of sebacic acid to give an ester polymer, and mixing 100 parts by weight of the ester polymer with 3 parts by weight of a crosslinking agent (supplied by Nippon Polyurethane Industry Co., Ltd. under the trade name "CORONATE L").

Production Example 1-3

A pressure-sensitive adhesive A-3 was prepared by mixing 100 parts by weight of an acrylic polymer with 10 parts by weight of an ultraviolet-curable urethane acrylate oligomer (supplied by Nippon Synthetic Chemical Industry Co., Ltd. under the trade name "SHIKOH UV1700"), 3 parts by weight of an initiator for active-energy-ray-induced polymerization (supplied by Ciba Japan (now part of BASF Japan Ltd.) under the trade name "IRGACURE 651"), and 3 parts by weight of a crosslinking agent (supplied by Nippon Polyurethane Industry Co., Ltd. under the trade name "CORONATE L"). The acrylic polymer was a copolymer obtained from 90 parts by weight of 2-ethylhexyl acrylate and 10 parts by weight of acrylic acid.

Production Example 1-4

A pressure-sensitive adhesive A-4 was prepared by reacting 100 parts by weight of a polycarbonatediol (supplied by Daicel Chemical Industries, Ltd. under the trade name "PLACCEL CD220PL") and 10 parts by weight of sebacic acid to give an ester polymer, and mixing 100 parts by weight of the ester polymer with 4 parts by weight of a crosslinking agent (supplied by Nippon Polyurethane Industry Co., Ltd. under the trade name "CORONATE L").

Production Example 1-5

A pressure-sensitive adhesive A-5 was prepared by dissolving, in methyl ethyl ketone, 100 parts by weight of an acrylic polymer (supplied by DAIICHI LACE K.K. (now Toray Coatex Co., Ltd.) under the trade name "Rheocoat R1020S"), 10 parts by weight of a pentaerythritol-modified acrylate crosslinking agent (supplied by Nippon Kayaku Co., Ltd. under the trade name "DPHA40H"), 0.25 part by weight of a crosslinking agent (supplied by Mitsubishi Gas Chemical Company, Inc. under the trade name "TETRAD C"), 2 parts by weight of a crosslinking agent (supplied by Nippon Polyurethane Industry Co., Ltd. under the trade name "CORONATE L"), and 3 parts by weight of an initiator for active-energy-ray-induced polymerization (supplied by Ciba Japan (now part of BASF Japan Ltd.) under the trade name "IRGACURE 651").

Production Example 2-1

Initially, an acrylic polymer having methacrylate groups in its side chains was prepared by providing an acrylic copolymer from 75 moles of 2-ethylhexyl acrylate, 25 moles of morpholinyl acrylate, and 25 moles of 2-hydroxyethyl acrylate, and binding 50% of hydroxyl groups derived from 2-hydroxyethyl acrylate in the copolymer with methacryloyloxyethyl isocyanate (2-isocyanatoethyl methacrylate). A pressure-sensitive adhesive B-1 was prepared by mixing 100 parts by weight of the prepared acrylic polymer with 50 parts by weight of an ultraviolet-curable urethane acrylate oligomer (supplied by Nippon Synthetic Chemical Industry Co., Ltd. under the trade name "SHIKOH UV1700"), 3 parts by weight of an initiator for active-energy-ray-induced polymerization (supplied by Ciba Japan (now part of BASF Japan Ltd.) under the trade name "IRGACURE 184"), and 1.5 parts by weight of a crosslinking agent (supplied by Nippon Polyurethane Industry Co., Ltd. under the trade name "CORONATE L"). The pressure-sensitive adhesive B-1 was applied to a separator (supplied by Mitsubishi Polyester Film GmbH (now part of Mitsubishi Plastics, Inc.) under the trade name "MRF38") using an applicator to have a dry thickness of 30 µm, dried, and thereby yielded a pressure-sensitive adhesive layer B-1.

Production Example 2-2

A pressure-sensitive adhesive B-2 was prepared by mixing 100 parts by weight of an acrylic polymer with 0.7 part by weight of an epoxy crosslinking agent (supplied by Mitsubishi Gas Chemical Company, Inc. under the trade name "TETRAD C") and 2 parts by weight of a crosslinking agent (supplied by Nippon Polyurethane Industry Co., Ltd. under the trade name "CORONATE L"). The acrylic polymer was a copolymer obtained from 100 parts by weight of butyl acrylate and 3 parts by weight of acrylic acid. The prepared pressure-sensitive adhesive B-2 was applied to a separator (supplied by Mitsubishi Polyester Film GmbH (now part of Mitsubishi Plastics, Inc.) under the trade name "MRF38") using an applicator to have a dry thickness of 30 µm, dried, and thereby yielded a pressure-sensitive adhesive layer B-2.

[Measurement of Young's Moduli of Base Layers A and B at 25° C. or 80° C.]

The Young's moduli of the base layers used in the examples and comparative examples were measured by the following method according to Japanese Industrial Standards (JIS) K7127. A tensile tester used herein was the Autograph AG-1kNG (equipped with a heating hood) supplied by Shimadzu Corporation.

A base cut to a size of 200 mm long and 10 mm wide was attached as a sample to the tensile tester at a chuck-to-chuck distance of 100 mm. After providing an atmosphere of 25° C. or 80° C. by the heating hood, the sample was pulled at a tensile speed of 5 mm/min, and a stress-strain curve was plotted from measured data. Loads at two points where the strain was 0.2% and 0.45% were determined to obtain Young's modulus. This measurement was repeated 5 times for the same sample, and the average value was employed as the Young's modulus at the temperature.

[Measurement of Shear Modulus of Pressure-Sensitive Adhesive Layer A at 80° C.]

The pressure-sensitive adhesives A-1 to A-5 prepared in Production Examples 1-1 to 1-5 were respectively applied to a separator (supplied by Mitsubishi Polyester Film GmbH (now part of Mitsubishi Plastics, Inc.) under the trade name "MRF38") using an applicator to have a dry thickness of 1.5 to 2 mm, dried, and thereby yielded pressure-sensitive adhesive layers A-1 to A-5. The prepared pressure-sensitive adhesive layers A-1 to A-5 were punched with a punch having a diameter 7.9 mm to give samples for measurement.

The shear moduli at 80° C. of the samples were measured using a viscoelastic spectrometer (ARES) supplied by Rheometric Scientific Inc., under a chuck pressure of 100 g at a shear frequency of 1 Hz.

[Measurement of Adhesive Strength of Pressure-Sensitive Adhesive Layer A to Base Layer A at 80° C.]

In this measurement, the same PET film [Lumirror S10 (thickness: 50 µm)] was used as a base layer A for each sample, and the adhesive strengths of the pressure-sensitive adhesives A-1 to A-5 to the base layer A were measured, in consideration that the adhesive strengths of the pressure-sensitive adhesives A-1 to A-5 to the base layer A vary depending typically on the material type and thickness of the base layer A.

Specifically, the pressure-sensitive adhesives A-1 to A-5 prepared in Production Examples 1-1 to 1-5 were respectively applied to Lumirror S10 (thickness: 50 µm) using an applicator to have a dry thickness of 30 µm, dried, and thereby yielded a pressure-sensitive adhesive layer A; another ply of Lumirror S10 (thickness: 50 µm) was arranged on and adhered to the pressure-sensitive adhesive layer A using a hand roller; and thereby yielded a series of multilayer sheets.

Each of the multilayer sheets was cut to a size of 10 mm wide, and the surface of one Lumirror S10 (thickness: 50 µm) was bonded to a rigid supporting substrate (silicon wafer) through a pressure-sensitive adhesive tape. A tensile jig of a peel tester was bonded to the surface of the other Lumirror S10 (thickness: 50 µm) through a pressure-sensitive adhesive tape. The assembly was placed on a heating stage (heater) at 80° C. so that the rigid supporting substrate was in contact with the heating stage. The tensile jig was pulled in a 180-degree direction at a tensile speed of 300 mm/min, and a force (N/10 mm) at the time when peeling occurred between Lumirror S10 (thickness: 50 µm) and the pressure-sensitive adhesive layer A was measured.

[Measurement of Young's Modulus of Pressure-Sensitive Adhesive Layer B at 80° C.]

The pressure-sensitive adhesive layer B-1 (or pressure-sensitive adhesive layer B-2) was irradiated with an ultraviolet ray (500 mJ/cm$^2$, 25 seconds), cut to a size of 50 mm long and 10 mm wide, and attached as a sample to a tester at a chuck-to-chuck distance of 10 mm. After providing an atmosphere of 80° C. by a heating hood, the sample was pulled at a tensile speed of 5 mm/min, and a stress-strain curve was plotted from measured data. Loads at two points where the strain was 0.2% and 0.45% were determined to obtain Young's modulus. This measurement was repeated 3 times for the same sample, and the average value was employed as the Young's modulus at 80° C.

[Measurement of Adhesive Strength of Pressure-Sensitive Adhesive Layer B to Silicon Wafer at 80° C.]

Each of the pressure-sensitive adhesive layers B-1 and B-2 prepared in Production Examples 2-1 and 2-2 was bonded to Lumirror S10 (thickness: 38 µm) using a hand roller to give multilayer sheets. Each of the multilayer sheets was cut to a size of 10 mm wide, from which the separator (supplied by Mitsubishi Polyester Film GmbH (now part of Mitsubishi, Plastics, Inc.) under the trade name "MRF38") on the pressure-sensitive adhesive layer B-1 or B-2 was removed, and the exposed pressure-sensitive adhesive layer B-1 or B-2 was bonded to a rigid supporting substrate (silicon wafer) using a hand roller. This was irradiated with an ultraviolet ray (500 mJ/cm$^2$, 25 seconds), and a tensile jig of a peel tester was bonded to the Lumirror S10 (thickness: 38 µm) through a pressure-sensitive adhesive tape. The assembly was placed on a heating stage (heater) at 80° C., so that the silicon wafer was in contact with the heating stage. The tensile jig was pulled in a 180-degree direction at a tensile speed of 300 mm/min, and a force (N/10 mm) at the time when peeling occurred between the Lumirror S10 (thickness: 38 µm) and the pressure-sensitive adhesive layer B was measured.

Example 1

The pressure-sensitive adhesive A-1 was applied to one side of Lumirror S10 (thickness: 25 µm) to have a dry thickness of 30 µm, and Spaceclean S7200 was superimposed and laminated thereon using a hand roller to give a multilayer sheet.

The pressure-sensitive adhesive layer side of the pressure-sensitive adhesive layer B-1 prepared in Production Example 2-1 was laminated on the Spaceclean S7200 side of the multilayer sheet, bonded thereto using a hand roller, and thereby yielded a pressure-sensitive adhesive sheet 1.

Example 2

A pressure-sensitive adhesive sheet 2 was produced by the procedure of Example 1, except for using the pressure-sensitive adhesive A-2 instead of the pressure-sensitive adhesive A-1.

Example 3

A pressure-sensitive adhesive sheet 3 was produced by the procedure of Example 1, except for using Lumirror S10 (thickness: 38 µm) instead of Lumirror S10 (thickness: 25 µm).

Example 4

A pressure-sensitive adhesive sheet 4 was produced by the procedure of Example 1, except for using Lumirror S10 (thickness: 50 µm) instead of Lumirror S10 (thickness: 25 µm).

Example 5

A pressure-sensitive adhesive sheet 5 was produced by the procedure of Example 1, except for using Lumirror S10 (thickness: 75 µm) instead of Lumirror S10 (thickness: 25 µm).

Example 6

A pressure-sensitive adhesive sheet 6 was produced by the procedure of Example 1, except for using the pressure-sensitive adhesive A-3 and Lumirror S10 (thickness: 50 µm) instead of the pressure-sensitive adhesive A-1 and Lumirror S10 (thickness: 25 µm), respectively.

Example 7

A pressure-sensitive adhesive sheet 7 was produced by the procedure of Example 1, except for using the pressure-sensitive adhesive A-3 and Lumirror S10 (thickness: 38 µm) instead of the pressure-sensitive adhesive A-1 and Lumirror S10 (thickness: 25 µm), respectively.

Comparative Example 1

A pressure-sensitive adhesive sheet 8 was produced by the procedure of Example 1, except for using Melinex (thickness: 100 µm) instead of Lumirror S10 (thickness: 25 µm).

Comparative Example 2

The pressure-sensitive adhesive A-1 was applied to one side of Lumirror S10 (thickness: 50 µm) to have a dry thickness of 30 µm, Spaceclean S5630 was superimposed thereon and bound using a hand roller to give a multilayer sheet.

The pressure-sensitive adhesive layer side of the pressure-sensitive adhesive layer B-1 prepared in Production Example 2-1 was laminated on and bonded to the Spaceclean S5630 side of the multilayer sheet using a hand roller, and thereby yielded a pressure-sensitive adhesive sheet 9.

Comparative Example 3

A pressure-sensitive adhesive sheet 10 was produced by the procedure of Example 1, except for using the pressure-sensitive adhesive A-4 instead of the pressure-sensitive adhesive A-1.

Comparative Example 4

A pressure-sensitive adhesive sheet 11 was produced by the procedure of Example 1, except for using the pressure-sensitive adhesive layer B-2 prepared in Production Example 2-2 instead of the pressure-sensitive adhesive layer B-1 prepared in Production Example 2-1.

Comparative Example 5

The pressure-sensitive adhesive A-1 was applied to one side of Lumirror S10 (thickness: 38 µm) to have a dry thickness of 30 µm, Spaceclean S7200 was superimposed thereon and laminated using a hand roller to give a multilayer sheet.

The pressure-sensitive adhesive layer side of the pressure-sensitive adhesive layer B-1 prepared in Production Example 2-1 was laminated on the Lumirror S10 side of the multilayer sheet, bonded thereto using a hand roller, and thereby yielded a pressure-sensitive adhesive sheet 12.

The pressure-sensitive adhesive sheets 1 to 12 prepared in the examples and comparative examples were evaluated on properties as a backgrinding tape and on peelability.

[Evaluation of Peelability of Pressure-Sensitive Adhesive Sheet]

Each of the pressure-sensitive adhesive sheets 1 to 12 prepared in the examples and comparative examples was affixed to a 4-inch mirror silicon wafer, subjected to a treatment in an autoclave at 40° C. under a pressure of 5 kgf/cm$^2$ for 5 minutes for better adhesion, and thereby yielded a series of laminates of the pressure-sensitive adhesive sheet and the wafer.

Each of the resulting laminates of the pressure-sensitive adhesive sheet and the wafer was irradiated with an ultraviolet ray (500 mJ/cm$^2$) and placed on a hot table at 80° C. or 90° C. equipped with pneumatic chucks.

After the placement, whether or not a "lifting" functioning as a peel starting point was present was visually observed, and the peelability was evaluated according to the following criteria.

Evaluation Criteria:
A: "Lifting" of 3 mm or more occurred over the entire perimeter of the wafer
B: "Lifting" of 1 mm or more and less than 3 mm occurred over the entire perimeter of the wafer
C: "Warping" of 1 mm or more occurred but not the entire perimeter of the wafer
D: No "warping" occurred
[Evaluation of "Warping" of Adherend After Polishing]

The evaluation was performed on the pressure-sensitive adhesive sheets prepared in Examples 3 and 4 and Comparative Example 5.

Specifically, each of the pressure-sensitive adhesive sheets prepared in Examples 3 and 4 and Comparative Example 5 was affixed to a 8-inch silicon wafer, polished to a wafer thickness of 27 μm using a backgrinding apparatus (supplied by DISCO Corporation under the trade name "DFG8560"), further subjected to mirror polish finishing using a polisher (supplied by DISCO Corporation under the trade name "DFP8140") and thereby yielded a series of wafers after polishing having a wafer thickness of 25 μm.

Each of the wafers after polishing was placed on a mold platen, and a distance between the mold platen and the farthest portion of the bent wafer after polishing from the mold platen was measured and defined as the "warping".

The results are all shown in the table below.

Each of the wafers after polishing was placed on a hot table equipped with pneumatic chucks, the pressure-sensitive adhesive sheet was heated with an industrial dryer to form a peel starting point, and a backgrinding-stripping tape (supplied by Nitto Denko Corporation under the trade name "BT315") was affixed thereto using a hand roller.

Next, 135-degree peel was performed using the backgrinding-stripping tape, and all the five pressure-sensitive adhesive sheets could be peeled off and recovered. These results demonstrate that the pressure-sensitive adhesive sheets according to the present invention are very practically useful in processing of semiconductor wafers.

TABLE 1

| | Base layer A | | Pressure-sensitive adhesive layer A | | Base layer B | |
|---|---|---|---|---|---|---|
| | Product of Young's modulus at 25° C. and thickness (N/m) | Product of Young's modulus at 80° C. and thickness (N/m) | Adhesive strength to PET at 80° C. (N/10 mm) | Shear modulus at 80° C. (MPa) | Product of Young's modulus at 25° C. and thickness (N/m) | Shrinkage percentage (%) in MD/shrink percentage (%) in TD at 80° C. |
| Example 1 | $10.63 \times 10^4$ | $8.75 \times 10^4$ | 4.24 | 0.031 | $8.73 \times 10^4$ | 40/40 |
| Example 2 | $10.63 \times 10^4$ | $8.75 \times 10^4$ | 10.41 | 0.174 | $8.73 \times 10^4$ | 40/40 |
| Example 3 | $16.15 \times 10^4$ | $1.33 \times 10^5$ | 4.24 | 0.031 | $8.73 \times 10^4$ | 40/40 |
| Example 4 | $21.25 \times 10^4$ | $1.75 \times 10^5$ | 4.24 | 0.031 | $8.73 \times 10^4$ | 40/40 |
| Example 5 | $31.88 \times 10^4$ | $2.63 \times 10^5$ | 4.24 | 0.031 | $8.73 \times 10^4$ | 40/40 |
| Example 6 | $21.25 \times 10^4$ | $1.75 \times 10^5$ | 7.83 | 0.048 | $8.73 \times 10^4$ | 40/40 |
| Example 7 | $16.15 \times 10^4$ | $1.33 \times 10^5$ | 7.83 | 0.048 | $8.73 \times 10^4$ | 40/40 |
| Comp. Ex. 1 | $41.4 \times 10^5$ | $3.22 \times 10^5$ | 4.24 | 0.031 | $8.73 \times 10^4$ | 40/40 |
| Comp. Ex. 2 | $21.25 \times 10^4$ | $1.75 \times 10^5$ | 4.24 | 0.031 | $13.62 \times 10^4$ | 80/0 |
| Comp. Ex. 3 | $21.25 \times 10^4$ | $8.75 \times 10^4$ | 7.47 | 0.288 | $8.73 \times 10^4$ | 40/40 |
| Comp. Ex. 4 | $21.25 \times 10^4$ | $8.75 \times 10^4$ | 4.24 | 0.031 | $8.73 \times 10^4$ | 40/40 |
| Comp. Ex. 5 | $8.73 \times 10^4$ | — | — | 0.72 | $16.15 \times 10^4$ | — |

| | Pressure-sensitive adhesive layer B | | | | |
|---|---|---|---|---|---|
| | Young's modulus at 80° C. (MPa) | Adhesive strength to wafer at 80° C. (N/10 mm) | Peelability 80° C. | Peelability 90° C. | "Warping" after polishing (mm) |
| Example 1 | 44 | 0.009 | A | A | — |
| Example 2 | 44 | 0.009 | B | B | — |
| Example 3 | 44 | 0.009 | A | A | 3.8 |
| Example 4 | 44 | 0.009 | A | A | 2.5 |
| Example 5 | 44 | 0.009 | A | A | — |
| Example 6 | 44 | 0.009 | B | B | — |
| Example 7 | 44 | 0.009 | B | B | — |
| Comp. Ex. 1 | 44 | 0.009 | D | D | — |
| Comp. Ex. 2 | 44 | 0.009 | C | C | — |
| Comp. Ex. 3 | 44 | 0.009 | D | D | — |
| Comp. Ex. 4 | 0.6 | 0.045 | D | D | — |
| Comp. Ex. 5 | 44 | 0.009 | — | — | 10 |

[Evaluation of Backgrinding Adaptability]

The pressure-sensitive adhesive sheet prepared in Example 4 was used in an experiment simulating a stripping step in wafer production processes, and the experiment was performed in the following manner.

After removing the separator (supplied by Mitsubishi Polyester Film GmbH (now part of Mitsubishi Plastics, Inc.) under the trade name "MRF38") therefrom, the pressure-sensitive adhesive sheet was affixed to 8-inch wafers. Next, the 8-inch wafers affixed to the pressure-sensitive adhesive sheet were polished to a wafer thickness of 27 μm using a backgrinding apparatus (supplied by DISCO Corporation under the trade name "DFG8560") and thereby yielded five wafers after polishing.

INDUSTRIAL APPLICABILITY

The pressure-sensitive adhesive sheet, the method of processing an adherend using the pressure-sensitive adhesive sheet, and the apparatus for stripping the pressure-sensitive adhesive sheet, each according to the present invention, are usable in processing of an adherend. Exemplary adherends include semiconductor wafers made from materials such as silicon and gallium arsenide, semiconductor packages, glass, and ceramics; and exemplary processings include grinding, cutting, polishing, mirror polishing, etching, turning, and heating (the heating is limited to one performed at a temperature lower than the thermal shrinkage starting temperature of the base layer B). When the pressure-sensitive adhesive sheet is adopted as a backgrinding tape for backgrinding of a semiconductor wafer to protect the semiconductor wafer typically from being damaged, the backgrinding tape can suppress "warping" of the semiconductor wafer even after the semiconductor wafer is polished to be very thin, and the backgrinding tape can be removed from the semiconductor wafer without damaging and contaminating the semiconductor wafer, after the backgrinding is completed and the backgrinding tape becomes unnecessary. Likewise, the processing method is usable as a method of processing an adherend using the backgrinding tape; and the stripping apparatus is usable as an apparatus for stripping the backgrinding tape without damaging and contaminating the semiconductor wafer.

REFERENCE SIGNS LIST 1 base layer A
2 pressure-sensitive adhesive layer A
3 base layer B
4 pressure-sensitive adhesive layer B
5 pressure-sensitive adhesive sheet
6 heating means, irradiation means for applying an ultraviolet ray
7 vacuum chuck stage
8 stripping tape for recovering pressure-sensitive adhesive sheet
9 ring frame
10 semiconductor wafer
11 dicing tape

The invention claimed is:

1. A pressure-sensitive adhesive sheet comprising a base layer A, a pressure-sensitive adhesive layer A, a base layer B, and a pressure-sensitive adhesive layer B as arranged in this order,
wherein the base layer A is a base layer having such a Young's modulus at 25° C., a Young's modulus at 80° C., and a thickness that the product of the Young's modulus at 25° C. and the thickness is $1.0 \times 10^5$ to $4.0 \times 10^5$ N/m and the product of the Young's modulus at 80° C. and the thickness is $2.8 \times 10^5$ N/m or less;
wherein the pressure-sensitive adhesive layer A is a pressure-sensitive adhesive layer having a shear modulus at 80° C. of 0.2 MPa or less;
wherein the base layer B has such a thickness and a Young's modulus at 25° C. that the product of the Young's modulus at 25° C. and the thickness is smaller than the product, of the base layer A, of the Young's modulus at 25° C. and the thickness, and wherein the base layer B is a heat-shrinkable base layer having, upon 80° C. heating, a shrink percentage in a main shrinkage direction of 20% or more and a shrink percentage in a direction perpendicular to the main shrinkage direction of 20% or more; and
wherein the pressure-sensitive adhesive layer B is a pressure-sensitive adhesive layer having a Young's modulus at 80° C. of 10 MPa or more and having an adhesive strength to a silicon wafer (180-degree peel at a tensile speed of 300 mm/min) of 0.2 N/10 mm or less.

2. The pressure-sensitive adhesive sheet according to claim 1, wherein the base layer A has, upon heating to 80° C., a shrink percentage of 1% or less and an expansion coefficient of 1% or less.

3. The pressure-sensitive adhesive sheet according to claim 1, wherein the pressure-sensitive adhesive layer B is a pressure-sensitive adhesive layer curable by the action of an active energy ray.

4. The pressure-sensitive adhesive sheet according to claim 1, wherein the pressure-sensitive adhesive layer B comprises an acrylic polymer containing a (meth)acrylate in its side chain; a crosslinking agent; and an initiator for active-energy-ray-induced polymerization.

5. A method of processing an adherend, the method comprising the steps of affixing the pressure-sensitive adhesive sheet as defined in claim 1 to an adherend; subjecting the affixed adherend to a predetermined processing; heating the pressure-sensitive adhesive sheet after the processing to thereby allow the pressure-sensitive adhesive sheet to bend so that the surface of the base layer A is bowed inward to give a lifting from the adherend; and stripping the pressure-sensitive adhesive sheet from the adherend.

6. The method of processing an adherend according to claim 5, wherein the pressure-sensitive adhesive sheet includes an active-energy-ray-curable pressure-sensitive adhesive layer as the pressure-sensitive adhesive layer B, and wherein the method comprises the steps of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, and carrying out heating to allow the pressure-sensitive adhesive sheet to bend so that the surface of the base layer A is bowed inward, to thereby form a lifting from the adherend.

7. The method of processing an adherend according to claim 5, wherein the step of stripping the pressure-sensitive adhesive sheet is performed by affixing a stripping tape to a periphery of the surface of the base layer A of the bent pressure-sensitive adhesive sheet; and pulling the stripping tape in a direction opposite to the adherend.

8. The pressure-sensitive adhesive sheet according to claim 2, wherein the pressure-sensitive adhesive layer B is a pressure-sensitive adhesive layer curable by the action of an active energy ray.

9. The pressure-sensitive adhesive sheet according to claim 2, wherein the pressure-sensitive adhesive layer B comprises an acrylic polymer containing a (meth)acrylate in its side chain; a crosslinking agent; and an initiator for active-energy-ray-induced polymerization.

10. The pressure-sensitive adhesive sheet according to claim 3, wherein the pressure-sensitive adhesive layer B comprises an acrylic polymer containing a (meth)acrylate in its side chain; a crosslinking agent; and an initiator for active-energy-ray-induced polymerization.

11. A method of processing an adherend, the method comprising the steps of affixing the pressure-sensitive adhesive sheet as defined in claim 2 to an adherend; subjecting the affixed adherend to a predetermined processing; heating the pressure-sensitive adhesive sheet after the processing to thereby allow the pressure-sensitive adhesive sheet to bend so that the surface of the base layer A is bowed inward to give a lifting from the adherend; and stripping the pressure-sensitive adhesive sheet from the adherend.

12. A method of processing an adherend, the method comprising the steps of affixing the pressure-sensitive adhesive sheet as defined in claim 3 to an adherend; subjecting the affixed adherend to a predetermined processing; heating the pressure-sensitive adhesive sheet after the processing to thereby allow the pressure-sensitive adhesive sheet to bend so that the surface of the base layer A is bowed inward to give a lifting from the adherend; and stripping the pressure-sensitive adhesive sheet from the adherend.

13. A method of processing an adherend, the method comprising the steps of affixing the pressure-sensitive adhesive sheet as defined in claim 4 to an adherend; subjecting the affixed adherend to a predetermined processing; heating the pressure-sensitive adhesive sheet after the processing to thereby allow the pressure-sensitive adhesive sheet to bend so that the surface of the base layer A is bowed inward to give a lifting from the adherend; and stripping the pressure-sensitive adhesive sheet from the adherend.

14. The method of processing an adherend according to claim 11, wherein the pressure-sensitive adhesive sheet includes an active-energy-ray-curable pressure-sensitive adhesive layer as the pressure-sensitive adhesive layer B, and wherein the method comprises the steps of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, and carrying out heating to allow the pressure-sensitive adhesive sheet to bend so that the surface of the base layer A is bowed inward, to thereby form a lifting from the adherend.

15. The method of processing an adherend according to claim 12, wherein the pressure-sensitive adhesive sheet includes an active-energy-ray-curable pressure-sensitive adhesive layer as the pressure-sensitive adhesive layer B, and wherein the method comprises the steps of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, and carrying out heating to allow the pressure-sensitive adhesive sheet to bend so that the surface of the base layer A is bowed inward, to thereby form a lifting from the adherend.

16. The method of processing an adherend according to claim 13, wherein the pressure-sensitive adhesive sheet includes an active-energy-ray-curable pressure-sensitive adhesive layer as the pressure-sensitive adhesive layer B, and wherein the method comprises the steps of affixing the pressure-sensitive adhesive sheet to an adherend, subjecting the affixed adherend to a predetermined processing, applying an active energy ray to the pressure-sensitive adhesive sheet to cure the pressure-sensitive adhesive layer B, and carrying out heating to allow the pressure-sensitive adhesive sheet to bend so that the surface of the base layer A is bowed inward, to thereby form a lifting from the adherend.

17. The method of processing an adherend according to claim 6, wherein the step of stripping the pressure-sensitive adhesive sheet is performed by affixing a stripping tape to a periphery of the surface of the base layer A of the bent pressure-sensitive adhesive sheet; and pulling the stripping tape in a direction opposite to the adherend.

* * * * *